(12) United States Patent
Mori et al.

(10) Patent No.: US 10,093,352 B2
(45) Date of Patent: Oct. 9, 2018

(54) MOTOR CONTROLLER, ELECTRIC POWER STEERING DEVICE USING THE MOTOR CONTROLLER, AND VEHICLE USING THE MOTOR CONTROLLER

(71) Applicant: NSK Ltd., Shinagawa-ku, Tokyo (JP)

(72) Inventors: Kenji Mori, Kanagawa (JP); Kotaro Tagami, Kanagawa (JP); Hiroki Sugawara, Gunma (JP); Shigeo Shinohara, Gunma (JP); Takaaki Sekine, Kanagawa (JP); Takeshi Senba, Gunma (JP); Shuji Endo, Gunma (JP)

(73) Assignee: NSK LTD., Tokyo (JP)

( * ) Notice: Subject to any disclaimer, the term of this patent is extended or adjusted under 35 U.S.C. 154(b) by 150 days.

(21) Appl. No.: 14/911,697

(22) PCT Filed: Dec. 13, 2013

(86) PCT No.: PCT/JP2013/007354
§ 371 (c)(1),
(2) Date: Feb. 11, 2016

(87) PCT Pub. No.: WO2015/022718
PCT Pub. Date: Feb. 19, 2015

(65) Prior Publication Data
US 2016/0200355 A1 Jul. 14, 2016

(30) Foreign Application Priority Data

Aug. 12, 2013 (JP) .................................. 2013-167859
Oct. 8, 2013 (JP) .................................. 2013-211071

(51) Int. Cl.
*B62D 5/04* (2006.01)
*H02P 21/22* (2016.01)
(Continued)

(52) U.S. Cl.
CPC ......... *B62D 5/0487* (2013.01); *B62D 5/0484* (2013.01); *H02H 7/0844* (2013.01);
(Continued)

(58) Field of Classification Search
CPC .. H02P 23/00; H02P 5/74; H02P 27/06; H02P 3/18; H02P 21/22; H02P 29/032;
(Continued)

(56) References Cited

U.S. PATENT DOCUMENTS 8,232,752 B2   7/2012   Kezobo et al.
8,421,388 B2   4/2013   Mukai
(Continued)

FOREIGN PATENT DOCUMENTS

CN       1934781 A      3/2007
CN     101595633 A     12/2009
(Continued)

OTHER PUBLICATIONS

Japanese Office Action issued in counterpart Japanese Application No. 2013-557312 dated Apr. 5, 2016, with English translation (eight (8) pages).
(Continued)

*Primary Examiner* — Behrang Badii
(74) *Attorney, Agent, or Firm* — Crowell & Moring LLP

(57) ABSTRACT

A motor controller, an electric power steering device using the motor controller, and a vehicle using the motor controller are provided. The motor controller includes plural hardware sets configured to operate in a normal state and to output a motor current, a control operation device configured to control the plurality of hardware sets commonly, an electric motor configured to operate with motor current output from each of the plurality of hardware sets, and an abnormality diagnosis unit configured to diagnose an abnormality of each of the plurality of hardware sets. In the control device, when
(Continued)

there is an abnormal hardware set that has been diagnosed by the abnormality diagnosis unit, the control operation device stops an operation of the abnormal hardware set that has been diagnosed, and continues driving of the electric motor with a normal hardware set.

10 Claims, 23 Drawing Sheets

(51) Int. Cl.
| | | |
|---|---|---|
| *H02H 7/08* | (2006.01) | |
| *H02P 29/032* | (2016.01) | |
| H02P 27/06 | (2006.01) | |
| G01R 31/34 | (2006.01) | |
| G05B 9/02 | (2006.01) | |
| H02P 5/74 | (2006.01) | |

(52) U.S. Cl.
CPC ............ *H02P 21/22* (2016.02); *H02P 29/032* (2016.02); *B62D 5/04* (2013.01); *B62D 5/0463* (2013.01); *B62D 5/0466* (2013.01); *G01R 31/34* (2013.01); *G01R 31/343* (2013.01); *G05B 9/02* (2013.01); *H02P 5/74* (2013.01); *H02P 27/06* (2013.01)

(58) Field of Classification Search
CPC ... H02P 29/027; B62D 5/0466; B62D 5/0487; B62D 5/0463; B62D 5/0481; B62D 5/0484; G01R 31/34; G01R 31/42; G01R 31/025; H02H 7/0844
See application file for complete search history.

(56) References Cited

U.S. PATENT DOCUMENTS

| | | | |
|---|---|---|---|
| 8,508,180 B2 | 8/2013 | Tagome et al. | |
| 9,543,862 B2* | 1/2017 | Kitanaka | H02P 5/74 |
| 2006/0043917 A1 | 3/2006 | Kifuku et al. | |
| 2006/0138883 A1* | 6/2006 | Yagai | H02K 3/522 |
| | | | 310/71 |
| 2007/0176577 A1 | 8/2007 | Kezobo et al. | |
| 2008/0078608 A1 | 4/2008 | Hara et al. | |
| 2009/0308683 A1* | 12/2009 | Suzuki | B62D 5/0463 |
| | | | 180/446 |
| 2011/0043152 A1 | 2/2011 | Kidokoro et al. | |
| 2011/0074333 A1 | 3/2011 | Suzuki | |
| 2011/0273122 A1 | 11/2011 | Murata et al. | |
| 2011/0316466 A1 | 12/2011 | Uryu | |
| 2013/0033207 A1 | 2/2013 | Satou et al. | |
| 2013/0121815 A1 | 5/2013 | Tsuboi | |
| 2015/0236623 A1* | 8/2015 | Kitanaka | H02P 5/74 |
| | | | 318/812 |

FOREIGN PATENT DOCUMENTS

| | | |
|---|---|---|
| JP | 63-31475 A | 2/1988 |
| JP | 2-52234 A | 2/1990 |
| JP | 2002-255054 A | 9/2002 |
| JP | 2006-67731 A | 3/2006 |
| JP | 2006-271018 A | 10/2006 |
| JP | 2006-320176 A | 11/2006 |
| JP | 2008-18911 A | 1/2008 |
| JP | 2008-236993 A | 10/2008 |
| JP | 2008-295122 A | 12/2008 |
| JP | 2009-89552 A | 4/2009 |
| JP | 2009-171769 A | 7/2009 |
| JP | 2009-232569 A | 10/2009 |
| JP | 2009-274686 A | 11/2009 |
| JP | 2010-29031 A | 2/2010 |
| JP | 2010-76714 A | 4/2010 |
| JP | 2011-78230 A | 4/2011 |
| JP | 2011-188653 A | 9/2011 |
| JP | 2011-239489 A | 11/2011 |
| JP | 2012-25373 A | 2/2012 |
| JP | 2012-116372 A | 6/2012 |
| JP | 4998836 B2 | 8/2012 |
| JP | 2013-5624 A | 1/2013 |
| JP | 2013-34281 A | 2/2013 |
| JP | 2013-141945 A | 7/2013 |
| WO | WO 2005/091488 A1 | 9/2005 |
| WO | WO 2012/0177727 A1 | 2/2012 |
| WO | WO 2012/105266 A1 | 8/2012 |

OTHER PUBLICATIONS

International Search Report (PCT/ISA/210) issued in PCT Application No. PCT/JP2013/007354 dated Mar. 18, 2014 with English translation (five pages).
Japanese-language Written Opinion (PCT/ISA/237) issued in PCT Application No. PCT/JP2013/007354 dated Mar. 18, 2014 (three pages).
Japanese Office Action issued in counterpart Japanese Application No. 2013-557312 dated Jul. 29, 2014 with English translation (six pages).
Japanese Office Action issued in counterpart Japanese Application No. 2013-557312 dated Dec. 16, 2014 with English translation (10 pages).
Japanese Office Action issued in counterpart Japanese Application No. 2013-557312 dated Sep. 1, 2015 with English translation (23 pages).
Japanese Office Action issued in counterpart Japanese Application No. 2015-025272 dated Jan. 26, 2016 with English translation (17 pages).
Chinese Office Action issued in counterpart Chinese Application No. 201380002313.4 dated Jul. 18, 2016 with English translation (20 pages).
European Search Report issued in counterpart European Application No. 13891490.8 dated Oct. 6, 2016 (eight pages).
Japanese Office Action issued in counterpart Japanese Application No. 2014-261499 dated Jun. 27, 2017 with English translation (four pages).
International Preliminary Report on Patentability (PCT/IB/338 & PCT/IB/373) issued in PCT Application No. PCT/JP2013/007354 dated Feb. 25, 2016, including English translation of document C2 (Japanese-language Written Opinion (PCT/ISA/237)) previously filed on Feb. 11, 2016 (six (6) pages).

* cited by examiner

MOTOR CONTROLLER, ELECTRIC POWER STEERING DEVICE USING THE MOTOR CONTROLLER, AND VEHICLE USING THE MOTOR CONTROLLER

TECHNICAL FIELD

The present invention relates to a motor controller that drives and controls a multiphase electric motor, an electric power steering device using the motor controller, and a vehicle using the motor controller.

BACKGROUND ART

The motor controller that drives and controls an electric motor of the electric power steering device mounted on a vehicle, an electric motor of an electric brake system, or an electric motor for travelling of an electric vehicle or a hybrid vehicle is demanded to continuously drive the electric motor, even if an abnormality occurs at the motor control system.

To meet the above demand, for example, a double system of the multiphase motor windings of the multiphase electric motor are provided, current is supplied to the multiphase motor windings in the double system from the individual inverter parts. When there arises an off failure, namely an open failure, in which switching means of one of the inverter parts cannot be electrically conductive, there is a proposal for a controller of a multiphase rotating machine and an electric power steering device using the controller (for example, see patent literature 1), the controller including failure-time control means that identifies the failed switching means where such a failure occurs, controls to exclude the failed switching means, and controls a normal inverter part except for the failed inverter part including the failed switching means.

CITATION LIST

Patent Literature

PTL 1: JP Patent Number: 4998836 B

SUMMARY OF INVENTION

Technical Problem

In a known example described in the above Patent Literature 1, however, when one of the inverter parts in the double system has an off failure of the switching means, another switching means is controlled to exclude the failed switching means and a q-axis current instruction value in the normal inverter part is corrected for a corresponding decrease in torque caused by controlling the failed inverter part including the failed switching means, so that the multiphase turning machine is driven and controlled continuously while suppressing a decrease in torque.

For this reason, in the above-described known example, when an off failure occurs at the switching means of the inverter part, enough torque can be produced. However, there is an unsolved problem that when a short-circuit failure occurs at the switching means of the inverter part, the failure cannot be addressed.

Thus, the present invention has been made by focusing on the unsolved problem of the known example, and has an object to provide a motor controller capable of continuously driving and controlling the electric motor, an electric power steering device using the motor controller, and a vehicle using the motor controller, even if an open failure or a short-circuit failure occurs at the motor drive circuit.

Solution to Problem

In order to address the above-described problems, according to one aspect of the present invention, there is provided a motor controller includes plural hardware sets configured to operate in a normal state and to output a motor current; a control operation device configured to control the plurality of hardware sets commonly; an electric motor configured to operate with motor current output from each of the plurality of hardware sets; and an abnormality diagnosis unit configured to diagnose an abnormality of each of the plurality of hardware sets. In the above-described motor controller, when there is an abnormal hardware set that has been diagnosed by the abnormality diagnosis unit, the control operation device stops an operation of the abnormal hardware set that has been diagnosed, and continues driving of the electric motor with a normal hardware set.

In addition, according to another aspect of the present invention, there is provided an electric power steering device, and the above-described motor controller is applied to a motor controller including an electric motor that generates a steering assistance force at a steering mechanism.

Further, according to still another aspect of the present invention, a vehicle includes the above-described motor controller.

Advantageous Effects of Invention

According to the present invention, the motor current supply systems for supplying the electric motor with the motor current are multiplexed. If an abnormality occurs at any of the multiplexed motor current supply systems or a disconnection abnormality occurs at a part of the coil units, the drive mode is changed to an abnormality mode. Therefore, even when an open failure or a short-circuit failure occurs at hardware including, for example, a motor drive circuit and the like, or even when a disconnection abnormality occurs at apart of the drive coil unit of the electric motor, the driving of the multiphase electric motor continues.

In addition, an electric power steering device includes the motor controller having the above advantages, even when an abnormality occurs at one of the multiphase motor drive currents of the multiplexed system, or even when an abnormality occurs at a part of the coil unit of the multiphase electric motor, the multiphase motor drive current is supplied to the electric motor, and the steering assistance function of the electric power steering device continues.

Further, a vehicle includes the motor controller having the above advantages, even when an abnormality occurs at least one of the multiphase motor drive currents of the multiplexed system in the multiphase electric motor, or even when an abnormality occurs at a part of the coil unit of the multiphase electric motor, the multiphase motor drive current is supplied to the electric motor to continue the torque generation at the electric motor, and the vehicle with the improved reliability of the electric motor is provided.

DESCRIPTION OF EMBODIMENTS

Hereinafter, embodiment of the present invention will be described with reference to the accompanied drawings.

Figure 1:
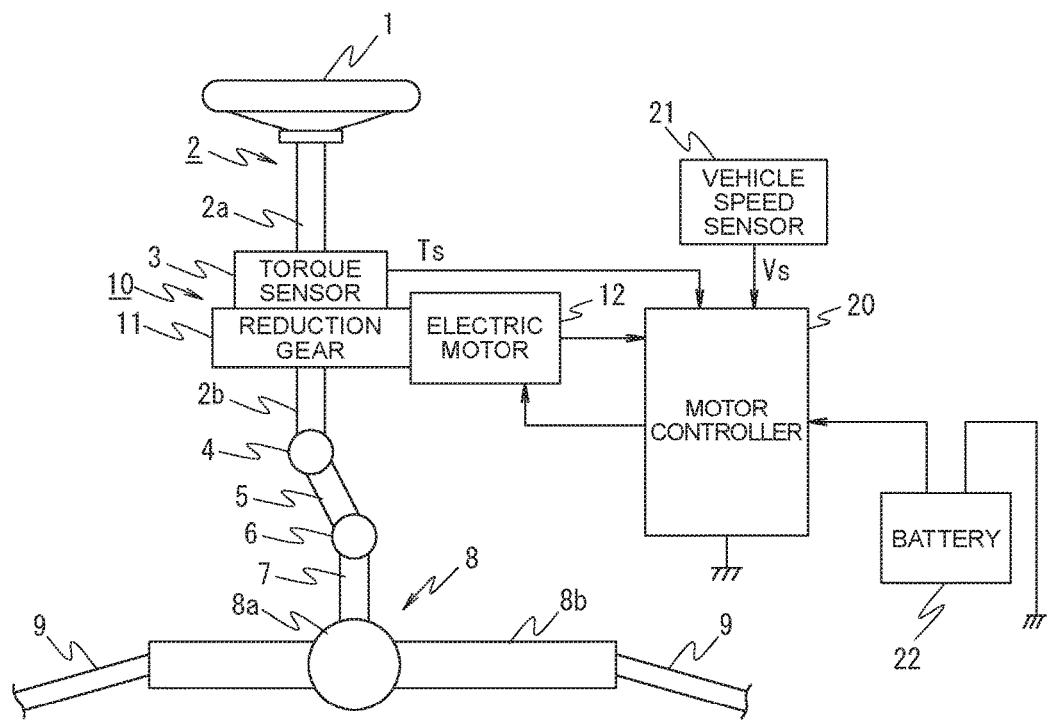
FIG. 1 is a view illustrative of a system configuration of an electric power steering device in a first embodiment of the present invention.

FIG. 1 is a view illustrative of the whole configuration in a first embodiment, in a case where the motor controller of the present invention is applied to an electric power steering device mounted on a vehicle.

In the drawing, numeral 1 is a steering wheel, and a steering force exerted to the steering wheel 1, which is operated by a driver, is transmitted to a steering shaft 2. The steering shaft 2 includes an input shaft 2a and an output shaft 2b. One end of the input shaft 2a is connected with the steering wheel 1, whereas the other end is coupled through a steering torque sensor 3 with one end of the output shaft 2b.

Then, the steering force that has been transmitted to the output shaft 2b is transmitted via a universal joint 4 to a lower shaft 5, and is further transmitted to a pinion shaft 7 via the universal joint 6. The steering force that has been transmitted to the pinion shaft 7 is transmitted to a tie rod 9 via a steering gear 8, so that turning wheels, not illustrated, are made to turn. Here, the steering gear 8 is configured to be a rack and pinion form having a pinion 8a connected with the pinion shaft 7 and a rack 8b engaging with the pinion 8a, and the rotational movement that has been transmitted to the pinion 8a is converted at the rack 8b into the straight travel of the vehicle in the widthwise direction.

The output shaft 2b of the steering shaft 2 is coupled with a steering assistance mechanism 10 that transmits a steering assistance force to the output shaft 2b. The steering assistance mechanism 10 includes a reduction gear 11 having, for example, a worm gear mechanism connected with the output shaft 2b, and a three-phase electric motor 12 operating as the electric motor having, for example, a three-phase brushless motor producing the steering assistance force and connected with the reduction gear 11.

Figure 2:
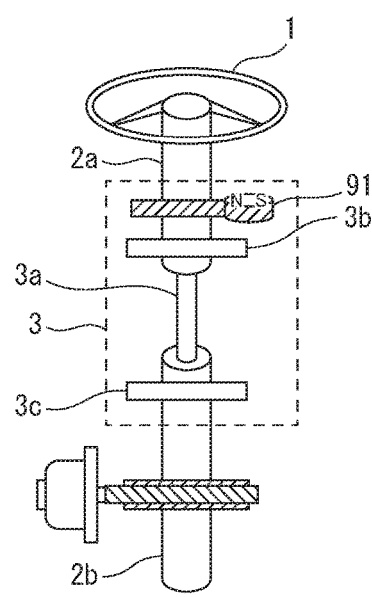
FIG. 2 is an outline configuration view illustrative of a torque sensor.

The steering torque sensor 3 detects steering torque exerted onto the steering wheel 1 and transmitted to the input shaft 2a. The steering torque sensor, for example, as illustrated in FIG. 2, converts the steering torque into a twisting angular displacement of a torsion bar 3a arranged between the input shaft 2a and the output shaft 2b, and to convert the twisting angular displacement into an angle difference between an input-side rotational angle sensor 3c arranged at the input shaft 2a side and an output side rotational angle sensor 3b arranged at the output shaft 2b side.

Figure 3:
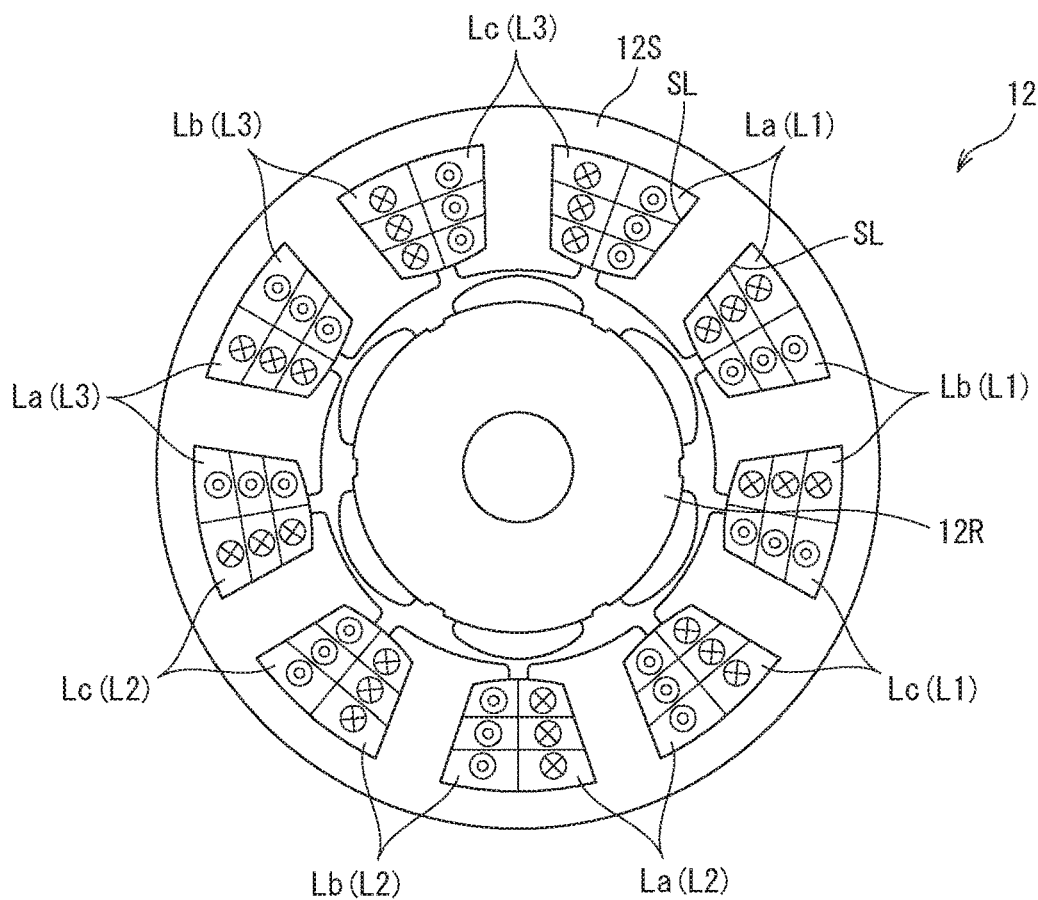
FIG. 3 is a cross-sectional view illustrative of a configuration of a three-phase electric motor in the first embodiment of the present invention.

In addition, the three-phase electric motor 12 has, as illustrated in FIG. 3, a motor configuration of Surface Permanent Magnet (SPM), including a stator 12S having, for example, nine teeth Te, which are magnetic poles formed to inwardly protrude on an inner circumferential surface and forming a slot SL, and a rotor 12R of surface permanent magnet having, for example, six magnetic poles formed to oppose the teeth Te on the inner circumferential of the stator 12S and arranged rotatably.

Figure 4:
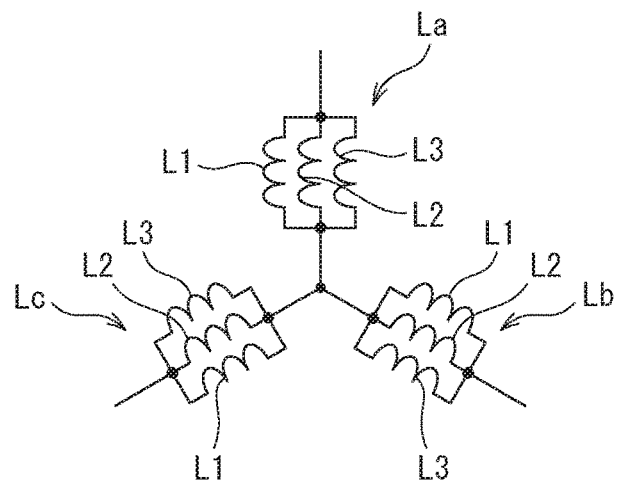
FIG. 4 is a schematic view illustrative of a winding structure of the three-phase electric motor of FIG. 3.

Then, the slot SL of the stator 12S has multiphase motor windings La, Lb, and, Lc of A phase, B phase, and C phase forming the three phases. The multiphase motor windings La, Lb and, Lc are, as illustrated in FIG. 4, for example, configured such that three coil units L1, L2, and L3 are connected to in parallel with one another and the coil units L1 to L3 are wound in three layers in the slot SL. One ends of the multiphase motor windings La, Lb, and Lc are connected together to form a star connection, whereas the other ends of the coil units La, Lb, and Lc are connected with a motor controller 20, so that motor drive currents Ia, Ib, and Ic are individually supplied.

Figure 5:
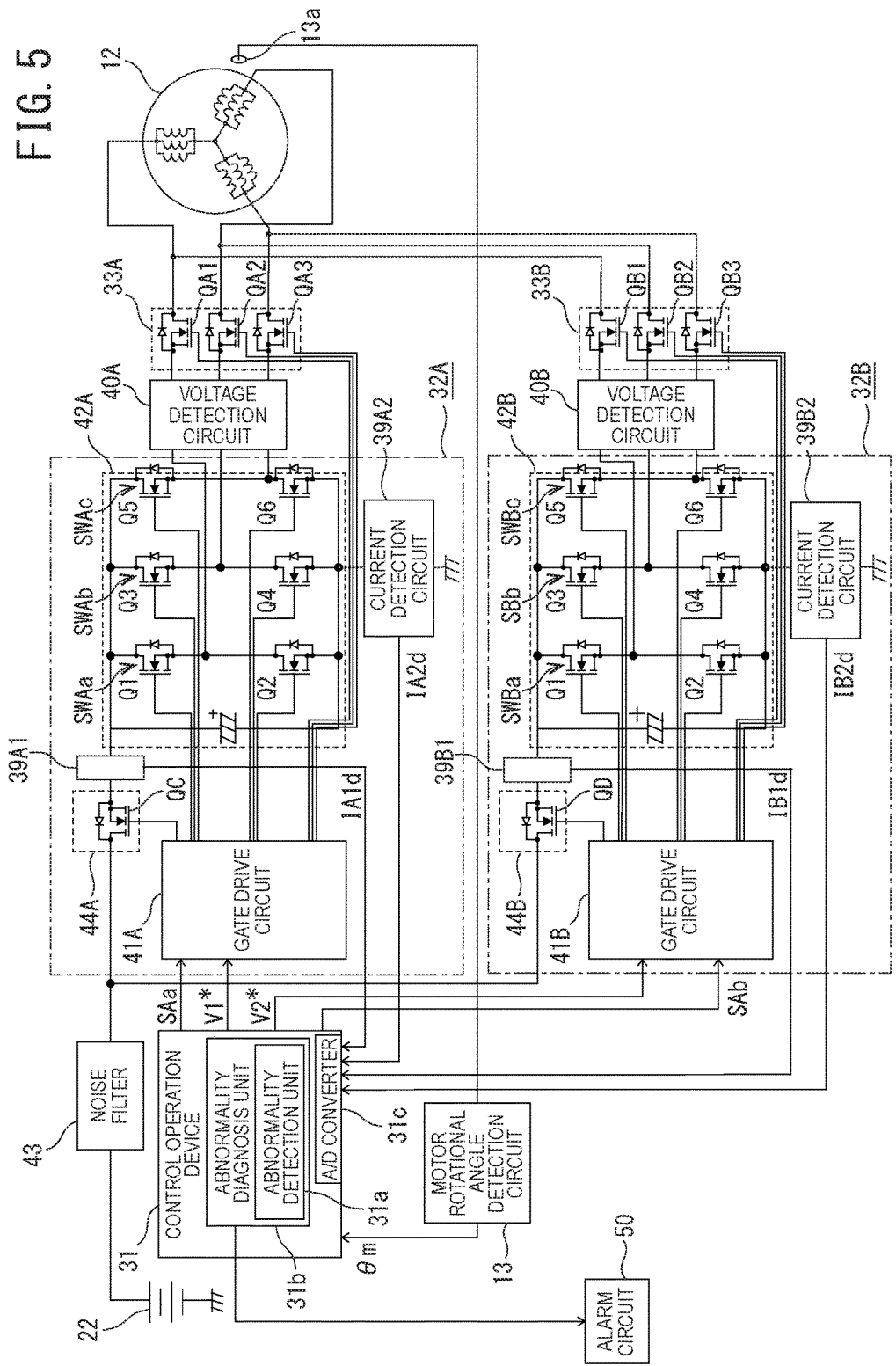
FIG. 5 is a circuit diagram illustrative of a specific configuration of a motor controller in the first embodiment of the present invention.

Further, the three-phase electric motor 12, as illustrated in FIG. 5, includes a rotational position sensor 13a such as a resolver detecting the rotational position of the motor. The detection value from the rotational position sensor 13a is supplied to a motor rotational angle detection circuit 13, and a motor rotational angle θm is detected in the motor rotational angle detection circuit 13.

Steering torque T detected by the steering torque sensor 3 and a vehicle speed Vs detected by a vehicle speed sensor 21 are input into the motor controller 20, and in addition, a motor rotational angle θm output from the motor rotational angle detection circuit 13 is input into the motor controller 20.

In addition, a direct current is input into the motor controller 20 from a battery 22 operating as a direct current voltage source.

A specific configuration of the motor controller 20 is illustrated in FIG. 5. In other words, the motor controller 20 includes a control operation device 31 operates a motor current instruction value, first and second motor drive circuits 32A and 32B configured with hardware into which three-phase motor voltage instruction values V1* and V2* output from the control operation device 31 are individually input, and first and second motor current cutoff units 33A and 33B respectively arranged between the output sides of the first and second motor drive circuits 32A and 32B and the first and second multiphase motor windings La to Lc of the three-phase electric motor 12.

Although not illustrated in FIG. 5, the steering torque T detected by the steering torque sensor 3 and the vehicle speed V detected by vehicle speed sensor 21, as illustrated in FIG. 1, are input into the control operation device 31. In addition, as illustrated in FIG. 5, the motor rotational angle θm output from the motor rotational angle detection circuit 13 is input into the control operation device 31, and motor currents Iad to Icd to energize the coils L1 to L3 of respective multiphase motor windings La to Lc of the three-phase electric motor 12 output from current detection circuits 39A and 39B, as will be described below are also input into the control operation device 31.

Figure 6:
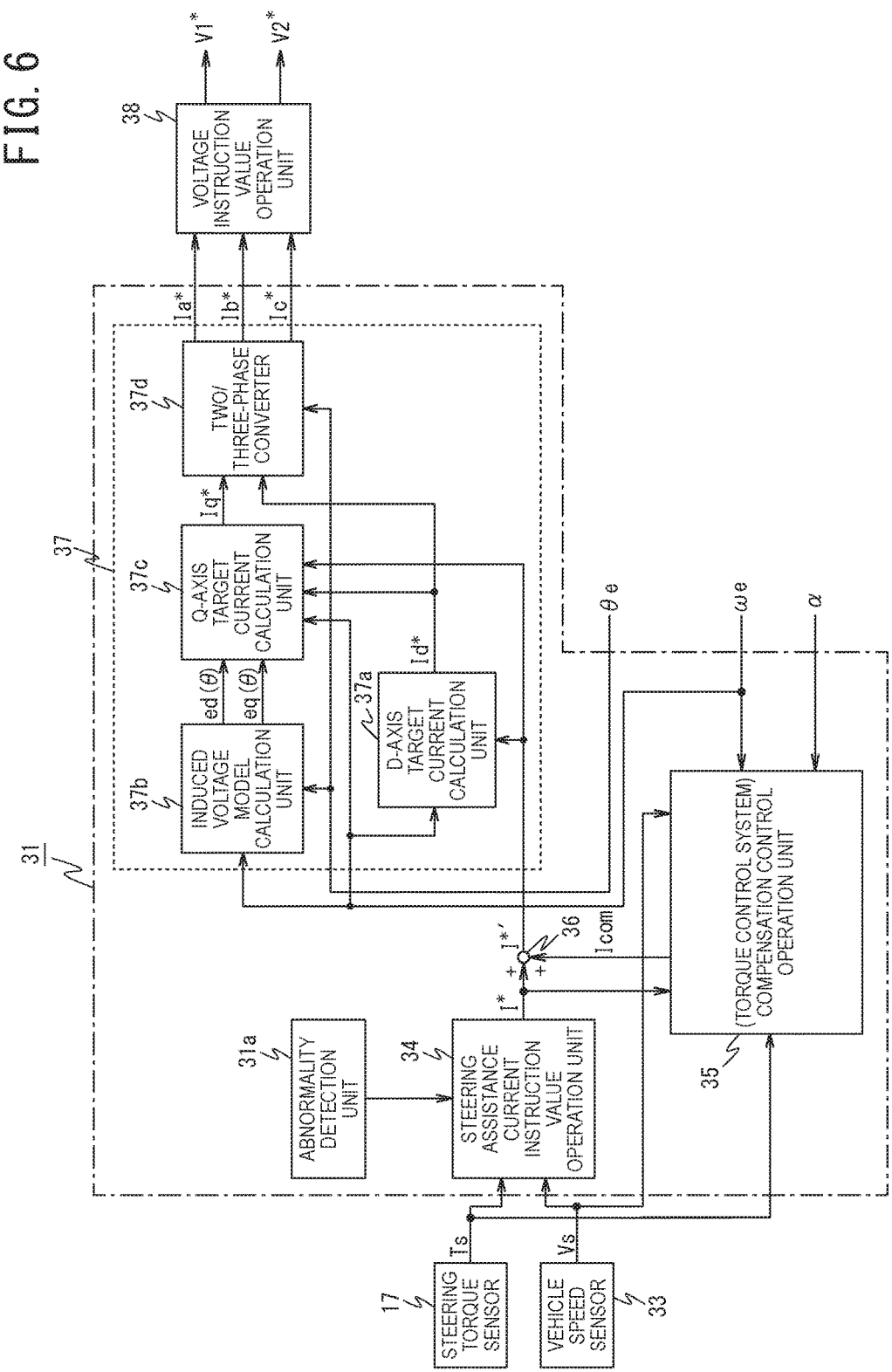
FIG. 6 is a block view illustrative of a specific configuration of a control operation unit of FIG. 5.

The control operation device 31, as illustrated in FIG. 6, includes a steering assistance current instruction value operation unit 34 calculates a steering assistance current instruction value I*, a compensation control operation unit 35 compensates the steering assistance current instruction value I* calculated by the steering assistance current instruction value operation unit 34 based on an angular velocity ωe and angular acceleration α, and a d-q axis current instruction value operation unit 37 calculates a d-q axis current instruction value based on a compensated torque instruction value I*' that has been compensated by the compensation control operation unit 35, and to convert the calculation result into a three-phase current instruction value.

Figure 7:
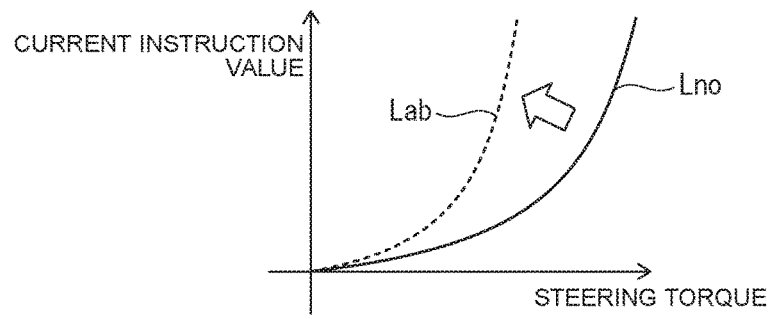
FIG. 7 is a characteristic diagram illustrative of a relationship between steering torque at a normal time and an abnormal time and a steering assistance current instruction value.

The steering assistance current instruction value operation unit 34 refers to a steering assistance current instruction value calculation map illustrated in FIG. 7 based on the steering torque Ts and the vehicle speed Vs, and to calculate the steering assistance current instruction value I*, which is a current instruction value. The steering assistance current instruction value calculation map, as illustrated in FIG. 7, includes characteristic diagrams represented by parabolic curves with the steering torque Ts being taken as the horizontal axis and the steering assistance current instruction value I* being taken as the vertical axis.

Then, when the motor drive circuits 32A and 32B are normal, the steering assistance current instruction value operation unit 34 calculates the steering assistance current instruction value I* by referring to a normal-time current instruction value calculation curve Lno represented as a solid line of FIG. 7 that is predetermined based on the steering torque T and the vehicle speed V. In addition, the steering assistance current instruction value operation unit 34 calculates the steering assistance current instruction value I* by referring to an abnormal-time current instruction value calculation curve Lab represented as a dotted line of FIG. 7 that is predetermined based on the steering torque T and the vehicle speed V, when the coil of the three-phase electric motor 12 is abnormal by its disconnection.

Here, the abnormal-time current instruction value calculation curve Lab has the increased gain with respect to the steering assistance current instruction value I* calculated as the normal-time current instruction value calculation curve Lno.

The compensation control operation unit 35 compensates a convergence torque compensation value of compensating a convergence of a yaw rate based on, for example, the motor angular velocity ωe and a corresponding torque amount generated by inertia of the electric motor 12 based on the motor angular velocity α, estimates a torque compensation value for preventing a degradation of the inertia feeling of or the control response property, and calculates a self-aligning torque (SAT) compensation value for compensation, so as to add all together and calculate an instruction value compensation value Icom.

Then, the compensation control operation unit 35 adds at an adder 36 the calculated instruction value compensation value Icom to the steering assistance current instruction value I* output from the steering assistance current instruction value operation unit 34, calculates a compensated current instruction value I*', and outputs the compensated current instruction value I*' to the d-q axis current instruction value operation unit 37.

In addition, the d-q axis current instruction value operation unit 37 includes a d-axis target current calculation unit 37a, an induced voltage model calculation unit 37b, a q-axis target current calculation unit 37c, and a two/three-phase converter 37d.

The d-axis target current calculation unit 37a calculates a d-axis target current Id* based on the compensated steering assistance current instruction value I*' and the motor angular velocity ωe.

The induced voltage model calculation unit 37b calculates a d-axis EMF component ed(θ) of a d-q axis induced voltage model EMF (Electro Magnetic Force) component ed(θ) and a q-axis EMF component eq(θ) based on the motor rotational angle θ and the motor angular velocity ωe.

The q-axis target current calculation unit 37c calculates a q-axis target current Iq* based on the d-axis EMF component ed(θ) and the q-axis EMF component eq(θ) output from the induced voltage model calculation unit 37b, the d-axis target current Id* output from the d-axis target current calculation unit 37a, the compensated steering assistance current instruction value I*', and the motor angular velocity ωe.

The two/three-phase converter 37d converts the d-axis target current Id* output from the d-axis target current calculation unit 37a and the q-axis target current Iq* output from the q-axis target current calculation unit 37c into three-phase current instruction values Ia*, Ib*, and Ic*.

In addition, the control operation device 31 includes a voltage instruction value operation unit 38 that calculates voltage instruction values V1* and V2* for the motor drive circuits 32A and 32B based on the calculated A-phase current instruction value Ia*, the calculated B-phase current instruction value Ib*, and the calculated C-phase current instruction value Ic*, and current detection values Iad, Ibd, and Icd detected by the current detection circuits 39A and 39B. The voltage instruction value operation unit 38 subtracts current detection values Iad, Ibd, and Icd from the A-phase current instruction value Ia*, the B-phase current instruction value Ib*, and the C-phase current instruction value Ic* to calculate current deviations ΔIa, ΔIb, and ΔIc, carries out, for example, a PI control operation or a PID control operation on the current deviations ΔIa, ΔIb, and ΔIc, calculates the three-phase voltage instruction values V1* and V2* for the first and second motor drive circuits 32A and 32B, and outputs the calculated three-phase voltage instruction values V1* and V2* to the first and second motor drive circuits 32A and 32B, respectively. Here, the three-phase voltage instruction values V1* and V2* are output from an abnormality detection unit 31a, as will be described later, as identical values to each other in the normal state where no abnormality is detected.

In addition, as illustrated in FIG. 5 and FIG. 8, the control operation device 31 receives motor-phase voltages V1ma, V1mb, V1mc, V2ma, V2mb, and V2mc detected by motor voltage detection circuits 40A and 40B, which are respectively arranged between the motor drive circuits 32A and 32B and the first and second motor current cutoff units 33A and 33B.

Further, as illustrated in FIG. 5, the control operation device 31 receives upper current detection values IA1d and IB1d respectively output from current detection circuits 39A1 and 39B1 that respectively detect direct currents supplied to inverter circuits 42A and 42B of the first and second motor drive circuits 32A and 32B, and lower current detection values IA2d and IB2d respectively output from current detection circuits 39A2 and 39B2 that respectively detect direct currents from the inverter circuits 42A and 42B to be flown to the ground.

Then, the control operation device 31 includes an abnormality diagnosis unit 31b including an abnormality detection unit 31a that detects an open failure of the upper arms and a short-circuit failure of the lower arms of field effect transistors (FET) Q1 to Q6 operating as switching elements included in first and second inverter circuits 42A and 42B to be described later, and a disconnection abnormality of any of the coil units L1 to L3 of the phase motor windings La, Lb, and Lc of the three-phase electric motor 12, after the motor-phase voltages Vm1a, Vm1b, Vm1c, Vm2a, Vm2b, and Vm2c, the upper current detection values IA1d and IB1d, and the lower current detection values IA2d and IB2d are input into the A/D converter 31c.

The abnormality detection unit 31a detects an abnormality as follows.

Figure 10:
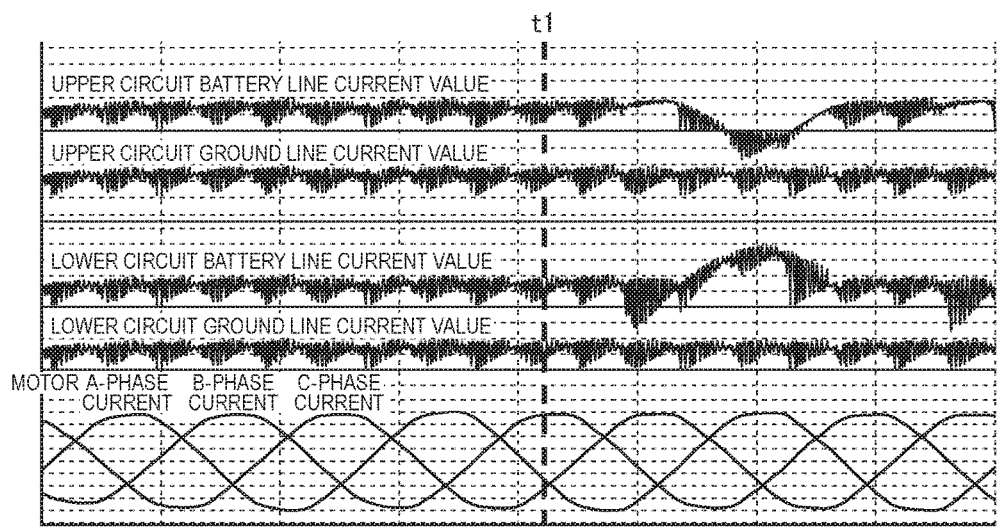
FIG. 10 is a waveform diagram illustrative of current waveforms of the part at the time of an open failure.

That is, as illustrated in FIG. 10, when an open failure occurs at, for example, the A-phase upper arm of the motor drive circuit 32A at time point t1, the upper current detection value IA1d of the motor drive circuit 32A decreases when the motor drive current Ia of the arm having the open failure is positive. To compensate the decrease, the upper current detection value IB1d of the motor drive circuit 32B will be increased.

Then, the motor drive circuit 32A or 32B having the open failure is identified by comparing the detected upper current detection values IA1d and IB1d with each other. An abnormality detection signal SAa or SAb having a logical value "1" is output to the motor drive circuit 32A or 32B having the open failure.

It is to be noted that when the open failure occurs at the upper arm, as illustrated in FIG. 10, the three-phase wave pattern of the motor drive current does not change in particular, and the steering assistance control continues.

Figure 11:
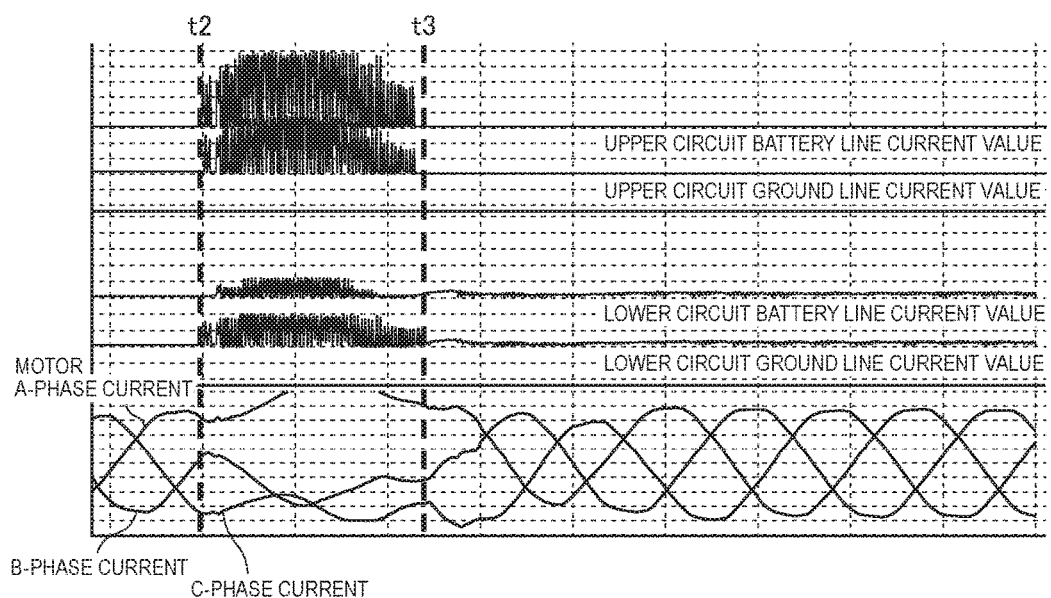
FIG. 11 is a waveform diagram illustrative of current waveforms of the part at the time of a short-circuit failure.

In addition, at the time point t2, as illustrated in FIG. 11, when a short-circuit failure occurs at the upper arm of the motor drive circuit 32A, for example, the upper arm of the phase A, the upper current detection value IA1d of the motor drive circuit 32A suddenly increases and there is a small increase in the upper current detection value IB1d of the motor drive circuit 32B. Thus, when an instantaneous value of the upper current detection value IA1d is equal to or higher than a predetermined threshold, the short-circuit failure of the upper arm can be determined.

In this case, the motor current largely fluctuates, as illustrated in FIG. 11. However, by cutting off the motor current cutoff unit 33A of the motor drive circuit 32A at time point t3, the motor drive current only from the motor drive circuit 32B is supplied to the respective phase motor windings La to Lc of the three-phase electric motor 12, and the motor drive current returns to a stable shape of sine wave. It is therefore possible to continue driving of the three-phase electric motor 12.

Here, as will be described later, a pulse width modulation (PWM) signal is input into the gate of the field effect transistors (FET) of the inverter circuits 42A and 42B, and therefore, the motor drive electric currents Ia to Ic output from the inverter circuits 42A and 42B become rectangular wave signals where the duty ratios are controlled. Therefore, when the instantaneous values of the motor drive electric currents Ia to Ic are detected and the rectangular wave signals being off is simply detected, a regular motor current value will not be presented.

Accordingly, in order to detect the upper current detection values IA1d and IB1d accurately, the upper current detection values IA1d and IB1d are supplied to a peak-hold circuit holding the peak values for more than a period as long as one cycle of the pulse width modulation signal. By holding the peak values, the peak (maximum) values of the upper current detection values IA1d and IB1d are detected promptly and accurately.

On the other hand, in the disconnection detection of the coil unit when a disconnection abnormality occurs at any one of the coil units L1 to L3 in the respective three-phase motor windings La to Lc of the three-phase electric motor 12, the disconnection of the coil unit can be detected by monitoring a change in the motor-phase resistance value, because the resistance value varies depending on the disconnection of any one of the coil units L1 to L3. In other words, for example, when the coil unit L3 of the A-phase motor winding La in FIG. 4 is disconnected, a motor-phase resistance R increases from (⅓)*Rc to (½)*Rc, where R is a resistance value for each of the coil units L1 to L3. Such a function is utilized for the disconnection abnormality detection.

As an example of the disconnection abnormality detection, a motor-phase voltage Vm, which can be calculated with values detected by the motor voltage detection circuits 40A and 40B, is presented as follows.

$$Vm = R*i + Ke*\omega \qquad (1)$$

Here, R represents a motor-phase resistance (fixed number), i represents a motor-phase current (detection value), Ke represents a motor back electromotive voltage fixed number, and ω represents a motor rotational velocity (detection value/operation value).

In the above expression (1), when ΔR is a motor-phase resistance change amount, the above expression (1) is presented as the following expression (2).

$$Vm=(R+\Delta R)*i+Ke*\omega \quad (2)$$

Thus, the motor-phase resistance value change amount ΔR can be represented as the following expression.

$$\Delta R=(Vm-Ke*\omega)/i-R \quad (3)$$

By substituting the voltage for motor (the detection value) and the motor rotational velocity ω (detection value/operation value) in the expression (3), the change amount ΔR of the resistance value R for motor can be calculated. Then, when the calculated change amount ΔR is smaller than a predetermined threshold, it is determined that such a change amount ΔR falls within variations, whereas when the change amount ΔR is equal to or larger than the predetermined threshold, the disconnection abnormality of any of the coil units L1 to L3 of the phase motor windings La to Lc can be determined.

In addition, when the abnormality detection unit 31a detects the disconnection abnormality in one coil unit Lk (k=1, 2, and 3) of the coil units L1 to L3 of the phase motor windings Lj (j=a, b, and c) of one of the respective phase motor windings La, Lb, and Lc of the three-phase electric motor 12, a back electromotive force Ej of the phase motor winding Lj is changed to ⅔ of the normal time by the disconnection abnormality of the coil unit Lk. For this reason, the gain Kj with respect to the motor current instruction value Ij* supplied to the phase motor winding Lj where the disconnection abnormality is detected is increased from "1" of the normal time to "3/2".

In other words, the energy relationship expression of the input and output of the three-phase electric motor 12 is represented as follows.

$$T*\omega=Ea*Ia+Eb*Ib+Ec*Ic \quad (4)$$

Here, T represents motor torque, ω represents a motor angular frequency, Ea, Eb and, Ec represent back electromotive voltages of the A-phase, B-phase, and C-phase, and Ia, Ib and, Ic represent motor currents of the A-phase, B-phase, and C-phase, respectively.

For example, when a disconnection abnormality occurs at the coil unit Lk of one of the phases, in parallel connection of the coil units L1 to L3, the back electromotive voltage Ej changes to ⅔ of the normal time. Accordingly, by increasing the gain Kj with respect to the current instruction value Ij* that generates a motor current Ij of the phase motor winding Lj from "1" of the normal time to "3/2", Ej*Ij takes an equal value to that of a case of a normal phase motor winding and a torque change is suppressed so that the torque can be controlled to be constant.

The first and second motor drive circuits 32A and 32B, each include gate drive circuits 41A and 41B that respectively receive the three-phase voltage instruction values V1* and V2* output from the control operation device 31 to form gate signals, and first and second inverter circuits 42A and 42B that respectively receives the gate signals output from the gate drive circuits 41A and 41B.

When the voltage instruction values V1* and V2* are input from the control operation device 31, each of the gate drive circuits 41A and 41B forms six gate signals, which have been subjected to the pulse width modulation (PWM) based on the voltage instruction values V1* and V2* and a carrier signal Sc of triangular wave, and outputs the gate signals to the inverter circuits 42A and 42B.

It is to be noted that the six PWM gate signals may be commonly generated at the control operation device 31 to be input into the inverter circuits 42A and 42B.

In addition, when the abnormality detection signal SAa input from the control operation device 31 is a logical value "0" (normal), the gate drive circuit 41A outputs three gate signals of high level to the motor current cutoff unit 33A, and also outputs the gate signal of high level to the power supply cutoff unit 44A. In addition, when the abnormality detection signal SAa is a logical value "1" (abnormal), the gate drive circuit 41A outputs three gate signals of low level to the motor current cutoff unit 33A at the same time to cut off the motor current, and outputs the gate signal of low level to the power supply cutoff unit 44A to cut off the battery power.

Similarly, when the abnormality detection signal SAb input from the control operation device 31 is a logical value "0" (normal), the gate drive circuit 41B outputs three gate signals of high level to the motor current cutoff circuit 33B, and also outputs the gate signal of high level to the power supply cutoff unit 44B. In addition, when the abnormality detection signal SAb is a logical value "1" (abnormal), the gate drive circuit 41B outputs three gate signals of low level to the motor current cutoff circuit 33B at the same time to cut off the motor current, and also outputs the gate signal of low level to the power supply cutoff unit 44B to cut off the battery power.

The first and second inverter circuits 42A and 42B, each receive the battery electric currents of a battery 22 via a noise filter 43, the power supply cutoff units 44A and 44B, and the current detection circuits 39A1 and 39B1, and are coupled on the input side with electrolytic capacitors CA and CB for smoothing.

The first and second inverter circuits 42A and 42B, each include six field effect transistors (FET) Q1 to Q6 operating as the switching elements, and three switching arms SWAa, SWAb, and SWAc and three switching arms SWBa, SWBb, and SWBc, in each of which two field effect transistors are connected in series, are connected in parallel.

The first and second inverter circuits 42A and 42B, each receive gate signals output from the gate drive circuits 41A and 41B at the gate of each of the field effect transistors Q1 to Q6. From connection points of the field effect transistors of the switching arms SWAa, SWAb, and SWAc, and SWBa, SWBb, and SWBc, the A-phase current Ia, the B-phase current Ib, and the C-phase current Ic are electrically conducted via the motor current cutoff units 33A and 33B to the three-phase motor windings La, Lb, and Lc of the three-phase electric motor 12.

In addition, the switching arms SWAa, SWAb, and SWAc, and SWBa, SWBb, and SWBc of the inverter circuits 42A and 42B are respectively connected with the field effect transistors Q2, Q4, and Q6 to be the lower arms, and are grounded through the current detection circuits 39A2 and 39B2, and motor currents I1a to I1c and I2a to I2c are respectively detected by the current detection circuits 39A and 39B.

Figure 8A:
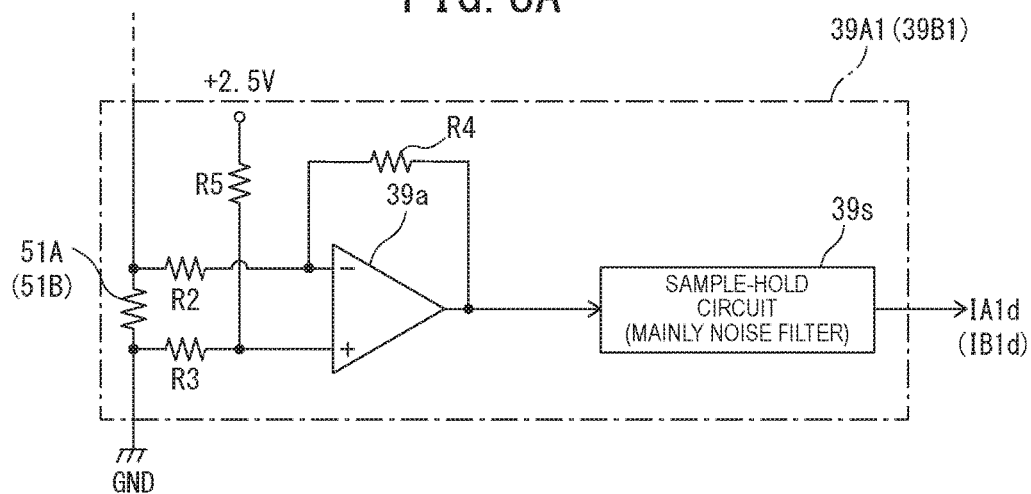
FIG. 8A and FIG. 8B are block diagrams illustrative of specific configurations of a current detection circuit.
Figure 8B:
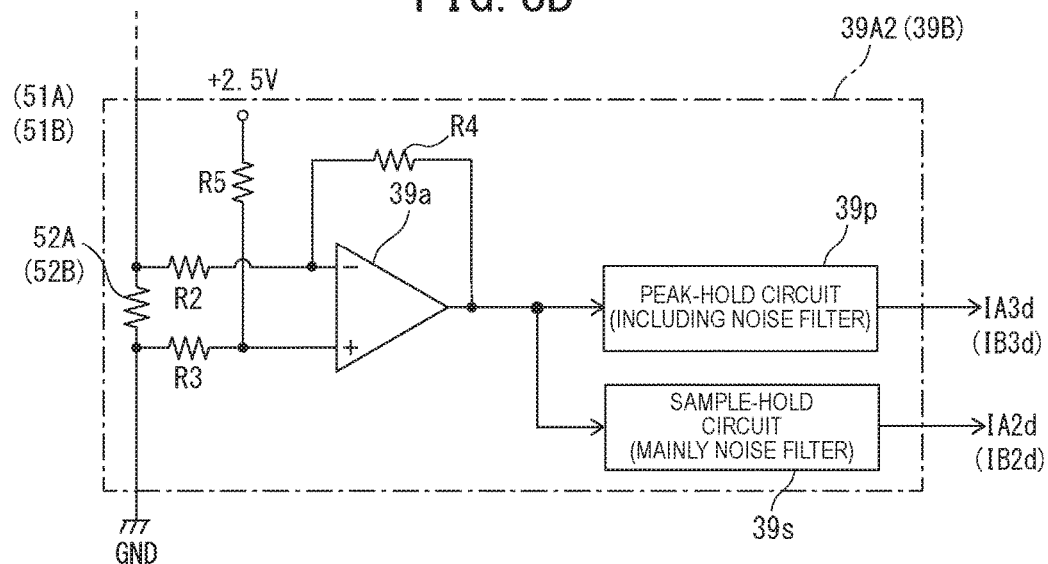
Figure 9:
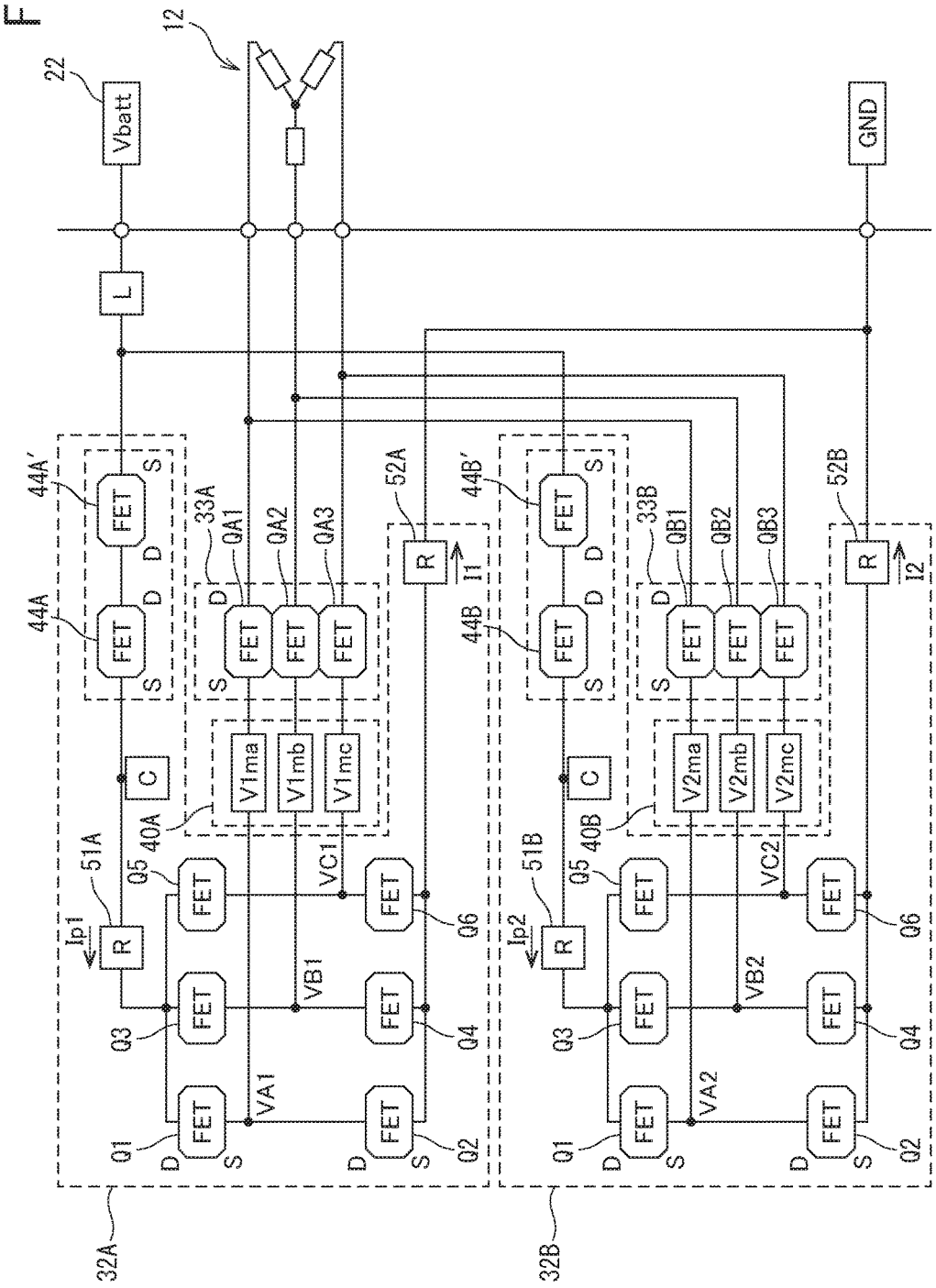
FIG. 9 is an outline configuration view illustrative of an abnormality detection circuit in an inverter circuit of FIG. 2.

The current detection circuits 39A1, 39A2, 39B1, and 39B2 are configured as illustrated in FIG. 8A and FIG. 8B. In other words, the current detection circuits 39A1 and 39B1, as illustrated in FIG. 9, respectively include current detecting shunt resistances 51A and 51B arranged between the power supply side of the switching arms SWAa to SWAc and SWBa to SWBc and the power supply cutoff units 44A and 44B. Each of the current detection circuits 39A1 and 39B1, as illustrated in FIG. 8A, includes an operational amplifier 39a into which voltages of both ends of the shunt resistances 51A and 51B are input through resistances R2 and R3, and a sample-hold circuit 39s mainly including a noise filter to which an output signal from the operational amplifier 39a is supplied.

Then, current detection signals IA1d and IB1d output from the sample-hold circuit 39s is supplied to an A/D converter 31c of the control operation device 31.

In addition, the current detection circuits 39A2 and 39B2, as illustrated in FIG. 9, include current detecting shunt resistances 52A and 52B arranged between the grounding side of the switching arms SWAa to SWAc and SWBa to SWBc and the ground. Each of the current detection circuits 39A2 and 39B2, as illustrated in FIG. 8B, includes an operational amplifier 39a into which voltages of both ends of the shunt resistances 52A and 52B are input into through the resistances R2 and R3, a peak-hold circuit 39p including a noise filter to which an output signal from the operational amplifier 39a is supplied, and a sample-hold circuit 39s including mainly a noise filter to which an output signal from the operational amplifier 39a is supplied.

Then, current detection signals IA2d and IB2d output from the sample-hold circuit 39s are supplied to an A/D converter 31c of the control operation device 31. In addition, peak-hold signals IA3d and IB3d of the current detection values output from the peak-hold circuit 39p are supplied to the A/D converter 31c and overcurrent-time cutoff circuits 70A and 70B and current bypass circuits 80A and 80B, as will be described later.

The motor current cutoff unit 33A includes three field effect transistors QA1, QA2, and QA3 for cutting off the current. The source of the field effect transistor QA1 is connected with a connection point of the transistors Q1 and Q2 of the switching arm SWAa of the first inverter circuit 42A through the motor voltage detection circuit 40A, and the drain of the field effect transistor QA1 is connected with the A-phase motor winding La of the three-phase motor windings L1.

In addition, the source of the field effect transistor QA2 is coupled with a connection point of the transistors Q3 and Q4 of the switching arm SWAb of the first inverter circuit 42A through the motor voltage detection circuit 40A, and the drain of the field effect transistor QA2 is connected with the three-phase motor winding Lb.

Further, the source of the field effect transistor QA3 is coupled with a connection point of the transistors Q5 and Q6 of the switching arm SWAc of the first inverter circuit 42A through the motor voltage detection circuit 40A, and the drain of the field effect transistor QA3 is connected with the three-phase motor winding Lc.

In addition, the motor current cutoff circuit 33B includes three field effect transistors QB1, QB2, and QB3 used for cutting off the current. Here, the source of the field effect transistor QB1 is connected with a connection point of the transistors Q1 and Q2 of the switching arm SWBa of the second inverter circuit 42B through the motor voltage detection circuit 40B, and the drain of the field effect transistor QB1 is connected with the three-phase motor winding La. In addition, the source of the field effect transistor QB2 is connected with a connection point of the transistors Q3 and Q4 of the switching arm SWBb of the second inverter circuit 42B through the motor voltage detection circuit 40B, and the drain of the field effect transistor QB2 is connected with the three-phase motor winding Lb. Further, the source of the field effect transistor QB3 is connected with a connection point of the transistors Q5 and Q6 of the switching arm SWBc of the second inverter circuit 42B through the motor voltage detection circuit 40B, and the drain of the field effect transistor QB3 is connected with the three-phase motor winding Lc.

Then, the field effect transistors QA1 to QA3 and QB1 to QB3 of the motor current cutoff units 33A and 33B are connected with the anodes of the parasitic diodes D in an identical direction on the inverter circuits 42A and 42B side.

In addition, each of the power supply cutoff units 44A and 44B respectively includes a parallel circuit including a field effect transistor (FET) QC and an FET QD, and a parasitic diode. The drains of the field effect transistors QC and QD are connected with a battery 22 through the noise filter 43, and the sauces of the field effect transistors QC and QD are respectively connected with the inverter circuits 42A and 42B. It is to be noted that the configurations of the power supply cutoff units 44A and 44B are not limited to the above ones. As illustrated in FIG. 9, two power supply cutoff units 44A and 44A', and 44B and 44B' may be connected in series with each other so that the parasitic diodes are arranged in opposite directions.

Next, operations in the above-described embodiment will be described.

When the ignition switch which is not illustrated is in an off state, and a vehicle stops, and in addition, in an operation stop state where the steering assistance control process also stops, the control operation device 31 of the motor controller 20 is in a non-operating state. Therefore, the steering assistance control process to be carried out by the control operation device 31 and the abnormality monitoring process stop. Thus, the electric motor 12 stops the operation, and the output of the steering assistance force to the steering assistance mechanism 10 stops.

From this operation stop state, when the ignition switch is turned to the on state, the control operation device 31 becomes in the operation state, and the steering assistance control process and the abnormality monitoring process start. Then, each of the field effect transistors Q1 to Q6 in the inverter circuits 42A and 42B of the motor drive circuits 32A and 32B is in the normal state where neither an open failure nor a short-circuit failure is occurring. In this case, in the non-steering state where the steering wheel 1 is not steered, the steering torque T is "0" in the steering assistance control process to be carried out by the control operation device 31, and the vehicle speed V is also "0". Hence, by referring to normal-time current instruction value calculation curve Lno in the solid line illustrated in the current instruction value calculation map of FIG. 7, the steering assistance current instruction value is calculated.

Then, the d-axis current instruction value Id* and the q-axis current instruction value Iq* are calculated based on the calculated steering assistance current instruction value I* and the motor electric angle θe input from the motor rotational angle detection circuit 13. Then, the A-phase current instruction value Ia*, the B-phase current instruction value Ib* and the C-phase current instruction value Ic* are calculated by carrying out the two/three-phase conversion process on the calculated d-axis current instruction value Id* and the q-axis current instruction value Iq*.

Further, the current deviations ΔIa, ΔIb, and ΔIc with respect to the phase current detection values Iad, Ibd, and Ibc are calculated from the phase current instruction value Ia*, Ib*, and Ic* and the phase current detection values IA1d and IB1d detected by the current detection circuits 39A and 39B. Then, the target voltage instruction values Va*, Vb*, and Vc* are calculated by carrying out the PI control process or the PID control process on the calculated current deviations ΔIa, ΔIb, and ΔIc.

Then, the calculated target voltage instruction values Va*, Vb*, and Vc* are respectively output as the voltage instruction values V1' and V2* to the gate drive circuits 41A and 41B in the first and second motor drive circuits 32A and 32B. In addition, as the inverter circuits 42A and 42B are normal, the control operation device 31 outputs the abnormality detection signals SAa and SAb of logic value "0" to the gate drive circuits 41A and 41B.

Hence, the gate drive circuits 41A and 41B respectively output three gate signals of high level to the motor current cutoff units 33A and 33B. Thus, the field effect transistors QA1 to QA3 and QB1 to QB3 of the motor current cutoff units 33A and 33B are in the on state, and the inverter circuits 42A and 42B and the three-phase motor windings L1 and L2 of the three-phase electric motors 12 turn in the electrically conducting state, so that electrically conducting control for the three-phase electric motor 12 is enabled.

At the same time, the gate signals of high level are output from gate drive circuits 41A and 41B to the power supply cutoff units 44A and 44B. Then, the field effect transistors QC and QD of the power supply cutoff units 44A and 44B are in the on state, and the direct currents from the battery 22 are supplied to inverter circuits 42A and 42B through the noise filter 43.

Further, the gate drive circuits 41A and 41B respectively form the gate signals by carrying out pulse width modulation based on the voltage instruction values V1* and V2* input from the control operation device 31. Then, the formed gate signals are respectively supplied to the gates of the field effect transistors Q1 to Q6 of the inverter circuits 42A and 42B.

Thus, when the vehicle is in the stop state and the steering wheel 1 is not steered, the steering torque Ts is "0". Accordingly, the steering assistance current instruction value also becomes "0" and the electric motor 12 keeps the stop state.

However, if the steering wheel 1 is steered in the vehicle stop state or the vehicle travel start state, that is, if so-called stationary steering is done, the steering torque Ts becomes larger. By referring to FIG. 7, a large steering assistance current instruction value I* is calculated, and in accordance with this, large voltage instruction values V1* and V2* are respectively supplied to the gate drive circuits 41A and 41B. Thus, the gate signals having duty ratios corresponding to the large voltage instruction values V1* and V2* are respectively output from the gate drive circuits 41A and 41B to the inverter circuits 42A and 42B.

Accordingly, depending on the steering assistance current instruction value I*, the A-phase current I1a, the B-phase current I1b, and the C-phase current I1c and the A-phase current I2a, the B-phase current I2b, and the C-phase current I3c, each having a phase difference of 120 degrees are respectively output from the inverter circuits 42A and 42B. The outputs are supplied to the three-phase motor windings La to Lc of the three-phase electric motor 12 through the field effect transistors QA1 to QA3 and QB1 to QB3, respectively corresponding to the phases of the motor current cutoff units 33A and 33B.

Accordingly, the electric motor 12 is driven for rotation, a large steering assistance force corresponding to the target steering assistance current value I* depending on the steering torque Ts is produced, and the steering assistance force is transmitted through the reduction gear 11 to the output shaft 2b. It is therefore possible to steer the steering wheel 1 with a light steering force.

Subsequently, when the vehicle speed Vs increases, the steering assistance current instruction value calculated in accordance with the vehicle speed Vs becomes lower than that at the time of the stationary steering, and the electric motor 12 generates the steering assistance force that is appropriately decreased depending on the steering torque Ts and the vehicle speed Vs.

Thus, when the inverter circuits 42A and 42B are normal and the motor currents Ia, Ib, and Ic supplied to the three-phase electric motor 12 are normal, the motor current appropriate for the steering torque Ts and the vehicle speed Vs is supplied to the three-phase electric motor 12.

From this normal state, when one or more short-circuit failures occur at the field effect transistors Q2, Q4, and Q6 on the lower arm side of, for example, the inverter circuit 42B, which is one of the first and second inverter circuits 42A and 42B of the first and second motor drive circuits 32A and 32B, the motor current Ij output to the motor current cutoff unit 33A from the switching arm SWBj (j=a, b, c) where the short-circuit failure has occurred. Therefore, when the abnormality detection unit 31a compares the phase current instruction values Ij*, the abnormality caused by the occurrence of the short-circuit failure can be detected. In addition, the voltage detection values of the motor voltage detection circuits 40A and 40B of FIG. 9 are not predetermined voltages, and an abnormality can be detected.

Thus, when the short-circuit failure occurs at the inverter circuit 42B of the motor drive circuit 32B, the abnormality detection signal SAa is kept at the logical value "0", whereas the abnormality detection signal SAb is the logical value "1". Therefore, driving of all the six gates of the inverter circuit 42B is turned off, and in addition, the three gate signals of low level are output to the motor current cutoff circuit 33B from the gate drive circuit 41B of the motor drive circuit 32B at the same time, and further, the gate signal of low level is output to the power supply cutoff units 44B.

Accordingly, in the motor current cutoff circuit 33B, the field effect transistors QB1 to QB3 of the respective phases are in the off state, and electrical conduction to the three-phase motor windings La to Lc of the three-phase electric motor 12 is cut off.

At the same time, also in the power supply cutoff unit 44B, the field effect transistor QD is controlled to turn in the off state, and electrically conducting path between the battery 22 and the second inverter circuit 42B is cut off.

However, since the motor drive circuit 32A operates normally and the voltage instruction value V1* to the motor drive circuit 32A does not change, the current control for the phase motor windings La to Lc of the three-phase electric motor 12 by the motor drive circuit 32A continues.

Hence, the steering assistance torque same as that at the normal time is generated by the three-phase electric motor 12 and the generated steering assistance torque is transmitted through the reduction gear 11 to the output shaft 2b, so that the steering assistance performance that compares well with that at the normal time can be brought out. At this time, when an abnormality of the motor drive circuit 32B is detected, an alarm signal Swa is output to an alarm circuit 50. Then, the abnormality of the motor drive circuit 32B is informed to a driver so as to encourage the driver to stop at the nearest service station.

In addition, when an open failure occurs at any one of the field effect transistors Q1, Q3, and Q5, for example, on the upper arm side of, for example, the inverter circuit 42A, which is one of the first and second inverter circuits 42A and 42B of the first and second motor drive circuits 32A and 32B, as described above based on FIG. 10, and when the motor drive current Ia of the arm at which the open failure has occurred becomes positive, the upper current detection value IA1*d* of the motor drive circuit 32A decreases, and to make up for this, the upper current detection value IB1*d* of the motor drive circuit 32B increases. Therefore, a difference is generated between the upper current detection value IA1*d* and the upper current detection value IB1*d*, so that the open failure occurring at the decreasing side of the upper current detection value can be determined.

On the contrary, when a short-circuit failure occurs at the upper arm of the motor drive circuit 32A of, for example, the A-phase upper arm, as described above in FIG. 11, the upper current detection value IA1*d* of the motor drive circuit 32A suddenly increases, whereas the upper current detection value IB1*d* of the motor drive circuit 32B slightly increases. Such a sudden increase of the upper current detection value IA1*d* and a slight increase of the upper current detection value IB1*d* are peak-held by a peak-hold circuit for at least a period equal to or longer than as long as one cycle of the pulse width modulated (PWM) signal. Thus, when an instantaneous value of the upper current detection value IA1*d* becomes equal to or higher than a predetermined threshold, the short-circuit failure of the upper arm is determined with certainty.

Accordingly, the respective phase switches QA1 to QA3 of the motor current cutoff unit 33A of the motor drive circuit 32A are controlled to be in the off state, and in addition, the power supply cutoff unit 44A is controlled to be in the off state. Driving of the motor drive circuit 32A stops, individual control of the three-phase electric motor 12 by the motor drive circuit 32B that is normal continues, as described above, and the steering assistance control that compares well with that at the normal time continues. At this timing, alarming is informed to a driver so as to encourage the driver to stop at the nearest service station.

Further, the abnormality detection unit 31*a* of the control operation device 31 calculates the motor-phase resistance value change amount ΔR of each phase by carrying out an operation of the above expression (3) based on the respective motor-phase voltages Vm1*a* to Vm1*c* and Vm2*a* to Vm2*c* detected by the motor voltage detection circuits 40A and 40B arranged on the output sides of the motor drive circuits 32A and 32B, the motor rotational velocity ω calculated by carrying out the differential operation on the motor rotational angle θm detected by the motor rotational angle detection circuit 13 or detected by separately providing a motor rotational velocity detection circuit, and motor-phase electric currents i*a* to i*c* obtained by adding the respective motor-phase electric currents i1*a* to i1*c* and i2*a* to i2*c* detected by the current detection circuits 39A and 39B, for each phase.

Then, when each motor-phase resistance value change amount ΔR of each motor-phase that has been calculated is smaller than a predetermined threshold ΔRn, it is determined to fall within the variation. However, when the motor-phase resistance value change amount ΔR is equal to or larger than the predetermined threshold ΔRn, the disconnection abnormality at any of the coil units L1 to L3 of the motor windings La to Lc of the three-phase electric motor 12 can be detected correctly.

In this manner, when the disconnection abnormality occurs at any of the coil units L1 to L3 of the motor windings La to Lc is detected, the characteristic curve of the steering assistance current instruction value calculation map to be referred by the steering assistance current instruction value operation unit 34 is changed to the characteristic curve Lab at the abnormality occurrence from the characteristic curve Lno at the normal time.

Therefore, the steering assistance current instruction value I* with respect to the value of the steering torque T detected by the steering torque sensor 3 becomes as much as two time the characteristic curve Lno at the normal time. The steering assistance current instruction value I*', which has been obtained by compensating the steering assistance current instruction value I* by the compensation control operation unit 35 with the compensation value Icom, is supplied to the d-q axis current instruction value operation unit 37. After being converted into the d-q axis current instruction value, it is subjected to the two-phase/three-phase conversion and the target current instruction values Ia*, Ib*, and Ic* are calculated.

These target current instruction values Ia*, Ib*, and Ic* are output by the voltage instruction value operation unit 38, as the voltage instruction values V1* and V2*, to the gate drive circuits 41A and 42B the motor drive circuits 32A and 32B.

Accordingly, in the motor drive circuits 32A and 32B, the motor drive electric currents Ia, Ib, and Ic for compensating the torque decrease by the disconnection of the coil unit Lk of the phase motor winding Lj is supplied to the phase motor windings La, Lb, and Lc of the three-phase electric motor 12, and in addition, a change suppression effect of the steering torque that has been higher enables suppression of a strange steering feel.

In addition, when the disconnection abnormality occurring at any of the coil units L1 to L3 of the motor windings La to Lc is detected, such a disconnection abnormality of one coil unit Lk changes the back electromotive force Ej of the phase motor winding Lj changes to ⅔ at the normal time. Therefore, the gain Kj with respect to the motor current instruction value Ij* supplied to the phase motor winding Lj at which the disconnection abnormality is detected is increased to "3/2" from "1" at a usual time.

Accordingly, Ej*Ij in the expression (4) representing input and output energy relationship formula of the above-described three-phase electric motor 12 has a value equal to that of the case of a normal phase motor winding, and the torque change is suppressed so that torque constant control can be performed. Also in this case, alarming is given by the alarm circuit 50 to inform the driver of the disconnection abnormality at the coil unit of the three-phase electric motor 12.

In this manner, in the above-described embodiment, hardware functioning two or more systems at the normal time is configured with the motor drive circuits 32A and 32B. Even if the failure occurs at one of the two or more systems of the hardware (or at one or more systems equal to or smaller than the total number of the systems), the function continues without a change in the control operation device or within a range where only parameters of the control operation device are changed so that a robust design can be achieved.

In addition, the motor drive circuits to become the motor current supply systems for supplying the motor current to the multiphase electric motor are configured to be multiplexed, and in addition, the respective motor windings of the multiphase electric motor are configured such that plural coil units are connected in parallel with each other. Hence, when an abnormality occurs at any of the motor drive circuits to become the multiplexed motor current supply systems, or when the disconnection abnormality occurs at a part of the coil unit of the multiphase electric motor, the driving mode is changed depending on the abnormality mode. Therefore, even when an open failure or a short-circuit failure occurs at the motor drive circuit to become the motor current supply system or even when the disconnection abnormality occurs at a part of the coil unit of the multiphase drive motor, driving of the multiphase electric motor continues.

Figure 12:
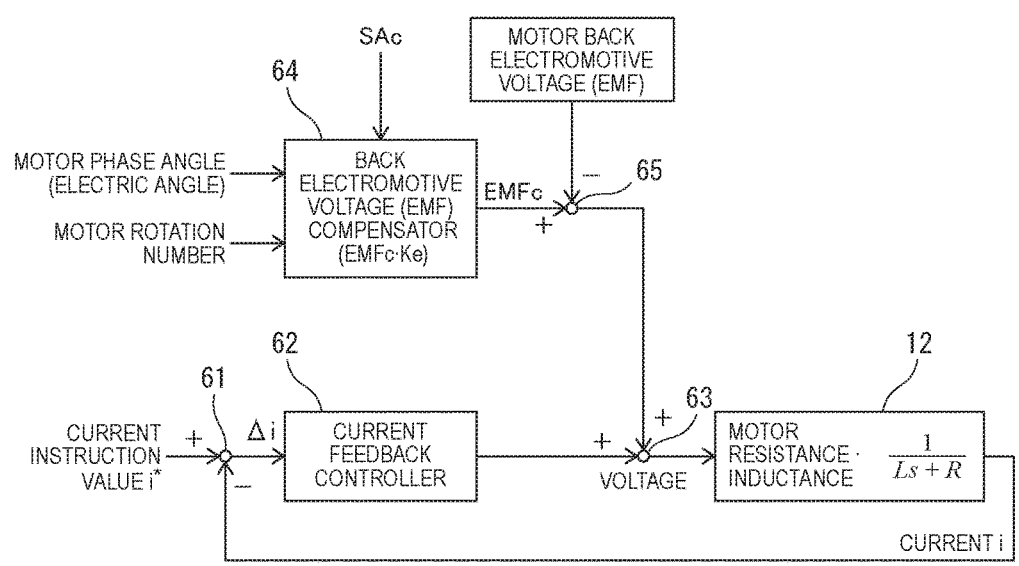
FIG. 12 is a block diagram illustrative of a back electromotive voltage compensation circuit.

In the above-described embodiment, the description has been given of the case where when the disconnection abnormality occurs at each coil unit Lk included in the phase motor winding Lj of the three-phase electric motor 12, the phase motor current ij is changed depending on a change in the back electromotive voltage Ej. However, the present invention is not limited to the above configurations. As illustrated in FIG. 12, a gain used to calculate the back electromotive voltage compensation value depending on a decrease in the motor back electromotive voltage (EMF) may be decreased.

In other words, the motor control system for one phase of the three-phase electric motor 12, as illustrated in FIG. 12, includes a subtracter 61 that operates a deviation between the current instruction value i* and the phase motor current i, and a current feedback controller 62 to which the current deviation Δi output from the subtracter 61 is supplied. Then, the motor voltage output from the current feedback controller 62 is supplied to an adder 63, and the output from the adder 63 is supplied to the three-phase electric motor 12. Hence, the motor current i is output, and is then supplied to the subtracter 61.

On the other hand, the motor rotational velocity w and the motor-phase angle (electric angle) ee are supplied to a back electromotive voltage (EMF) compensator 64. The back electromotive voltage (EMF) compensator 64 calculates the back electromotive voltage EMF based on the motor rotational velocity and the motor-phase angle 9e, the compensation gain Kc is multiplied by the calculated back electromotive voltage compensation value EMF to obtain the back electromotive voltage compensation value EMFc. The back electromotive voltage compensation value EMFs is supplied to a subtracter 65 to which the back electromotive voltage EMF has been supplied, and the subtraction output from the subtracter 65 is supplied to the adder 63. Here, the subtraction of the motor back electromotive voltage (EMF) by the subtracter 65 is in fact a physical phenomenon generated in a motor, and the subtracter 65 does not exist in fact.

The back electromotive voltage compensator 64 sets the gain Kc to "1", when the abnormality detection signal SAc used for detecting the disconnection abnormality of any of the coil units L1 to L3 by the above-described abnormality detection unit 31a is a logical value "0" representing the absence of abnormality, and the back electromotive voltage compensator 64 sets the gain Kc to "⅔", when the abnormality detection signal SAc is a logical value "1" representing the presence of abnormality.

According to such a configuration, when the corresponding any of the coil units L1 to L3 of the motor winding Lk is normal, the abnormality detection signal SAc input into the back electromotive voltage compensator 64 from the abnormality detection unit 31a is a logical value "0" and the gain Kc is set to "1". Therefore, the back electromotive voltage EMF, which is calculated by the back electromotive voltage compensator 64 by using the motor rotational velocity c and the motor-phase angle θe, is output to the subtracter 65 without change, as the back electromotive voltage compensation value EMFc.

Thus, the back electromotive voltage EMF generated at the motor winding Lk of the three-phase electric motor 12 is offset by the back electromotive voltage compensation value EMFc, and the motor current i of the three-phase electric motor 12 is controlled to be a value according to the current instruction value i*.

From this state, when the disconnection abnormality occurs at the coil units L1 to L3 of the motor winding Lk and such an abnormality is detected by the abnormality detection unit 31a, the abnormality detection signal SAc of a logical value "1" is supplied from the abnormality detection unit 31a to the back electromotive voltage compensator 64. Therefore, the gain Kc is set to "⅔" by the back electromotive voltage compensator 64, and the back electromotive voltage compensation value EMFc becomes ⅔ the back electromotive voltage compensation value EMFc of the normal time.

On the other hand, as the corresponding one of the coil units L1 to L3 of the motor winding Lk has a disconnection abnormality in the three-phase electric motor 12, the back electromotive voltage EMF to be generated is ⅔ the back electromotive force EMF of the normal time, and the back electromotive voltage EMF is offset by the back electromotive voltage compensation value EMFc at the subtracter 65. Thus, the torque variation is suppressed and torque constant control continues. Also in this case, the alarm circuit 50 gives alarming to inform the driver of the coil unit disconnection abnormality of the three-phase electric motor 12.

Besides, when the disconnection abnormality occurs at each coil unit Lk included in the phase motor winding Lj of the three-phase electric motor 12, the phase motor current ij may be changed depending on the change of the back electromotive force Ej, and in addition, the gain to calculate the back electromotive voltage compensation value may be decreased depending on the decrease of the motor back electromotive voltage (EMF). In this case, better effectiveness can be obtained.

In addition, in the above-described embodiment, the description has been given of the case where the abnormality detection unit 31a detects a short-circuit abnormality of the lower arms of the motor drive circuits 32A and 32B, and the motor current is cut off by the motor current cutoff unit 33A or 33B of the motor drive circuit 32A or 32B where the short-circuit abnormality occurs. However, after the short-circuit abnormality is detected, the cutoff control of the motor current cutoff unit 33A or 33B is carried out by a software process of the control operation device 31. Hence, it takes time for the motor current cutoff unit 33A or 33B to start the cutoff operation after the short-circuit abnormality is detected, and there is a limit in that the motor current cutoff unit 33A or 33B carries out the cutoff operation in a short period.

Thus, according to the present invention, in the above-described embodiment in which the overcurrent state is detected by hardware, the motor current cutoff units 33A and 33B and the power supply cutoff units 44A and 44B carry out the cutoff operation on a hardware basis.

Figure 13:
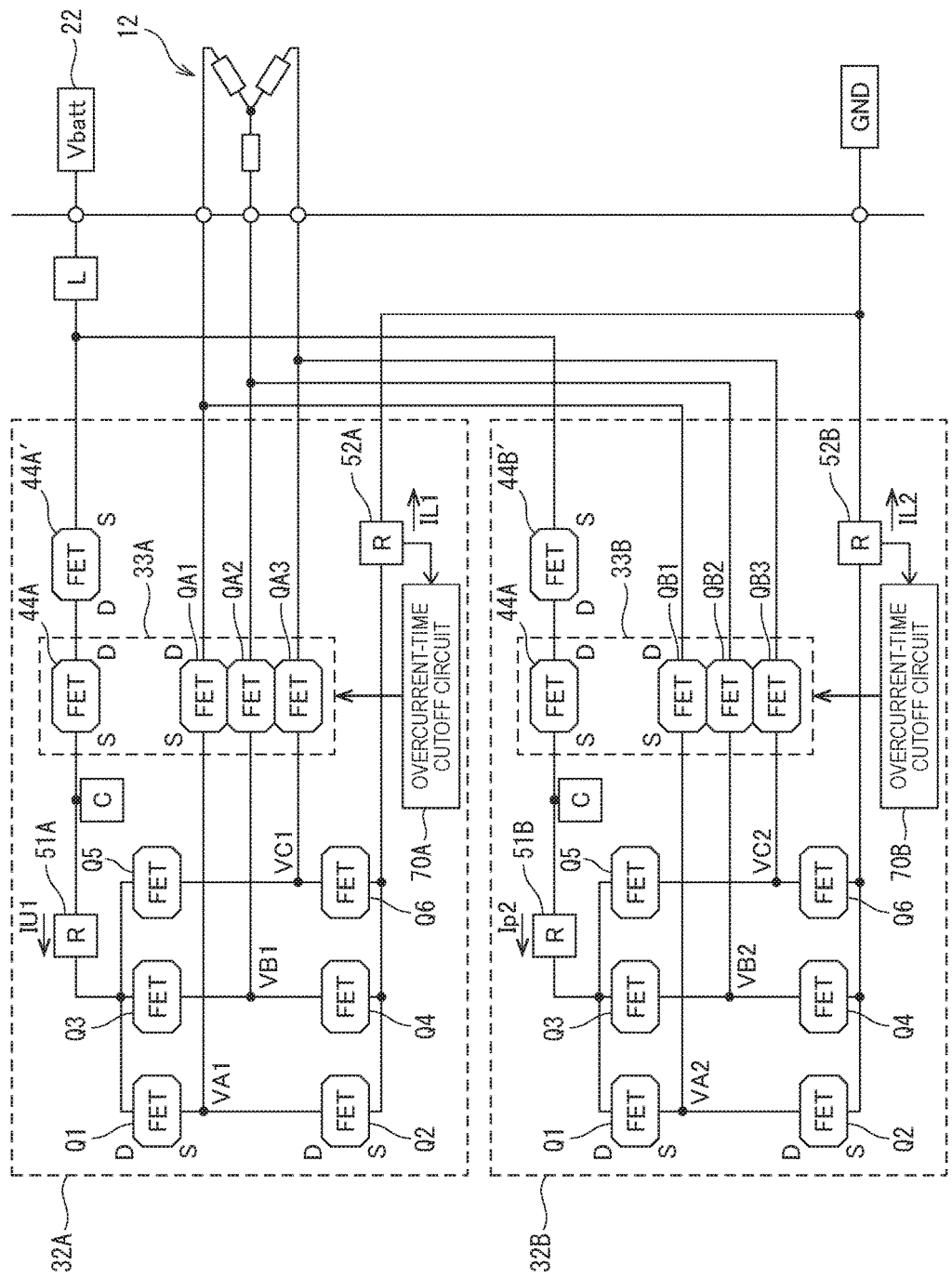
FIG. 13 is a block diagram illustrative of an overcurrent-time cutoff circuit.

In other words, as illustrated in FIG. 13, current detection values IA3d and IB3d detected by peak-hold circuits 39p of the current detection circuits 39A and 39B are respectively supplied to overcurrent-time cutoff circuits 70A and 70B configured with hardware, and the overcurrent-time cutoff circuits 70A and 70B respectively carry out the cutoff operation of the motor current cutoff units 33A and 33B and the power supply cutoff units 44A and 44B.

Figure 14:
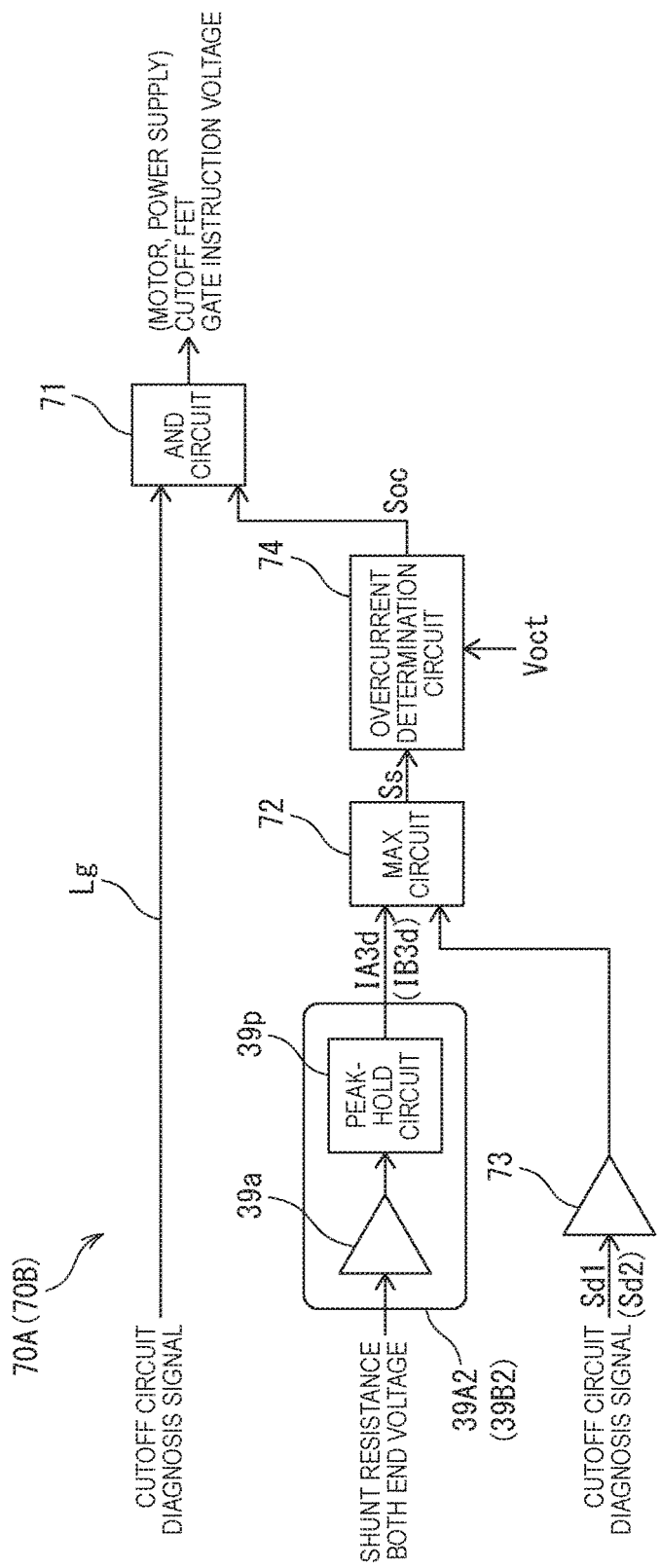
FIG. 14 is a block diagram illustrative of a specific configuration of the overcurrent-time cutoff circuit of FIG. 13.

Each of the overcurrent-time cutoff circuits 70A and 70B is configured as illustrated in FIG. 14. That is, for example, the motor drive circuit 32A will be described. An AND circuit 71 is arranged at a gate signal supply line Lg between the gate drive circuit 41A and the motor current cutoff unit 33A, which have been described above. Also, the current detection value IA3d output from the peak-hold circuit 39p of the current detection circuit 39A2 is supplied to one of input sides of a maximum value selection circuit 72, and a diagnosis signal Sd1 output from the control operation device 31 is input into the other one of the input sides of the maximum value selection circuit 72 through an amplifier 73. The maximum value selection circuit 72 selects the current detection value IA3d when the diagnosis signal Sd1 is not input, and selects the diagnosis signal Sd1 when the diagnosis signal Sd1 is input. Here, the control operation device 31 alternately outputs the diagnosis signals Sd1 and S2d, for example, by a timer interruption process, at every predefined time, for example, every minute. Alternatively, the state where the steering assistance is not performed by the motor is detected and the diagnosis signals Sd1 and Sd2 are output.

A selection signal Ss output from the maximum value selection circuit 72 is supplied to an overcurrent determination circuit 74 configured to determine the overcurrent state or not. When the selection signal Ss to be input into the overcurrent determination circuit 74 is equal to or higher than an overcurrent threshold Voct, an overcurrent determination signal Soc of low level is output, whereas when the selection signal Ss is smaller than the overcurrent threshold Voct, an overcurrent determination signal Soc of high level is output. Such an overcurrent detection signal Soc is supplied to the other one of the input sides of the AND circuit 71. Here, the overcurrent threshold Voct is set to a value (Voct=Ioct×Rs) obtained by multiplying resistance values Rs of current detection resistances (shunt resistances) 52A and 52B by an overcurrent threshold Ioct. For example, 150 A is set as the overcurrent threshold Ioct, and 1 mΩ is set as the resistance Rs of the current detection resistances 52A and 52B.

By configuring the overcurrent-time cutoff circuits 70A and 70B as described above, in a state where the diagnosis signal Sd1 is not output from the control operation device 31, the maximum value selection circuit 72 selects the current detection value IA3d detected by the peak-hold circuit 39p of the current detection circuit 39A2, and supplies the selected value to the overcurrent determination circuit 74 as the selection signal Ss.

Therefore, in the state where no short-circuit abnormality occurs at the field effect transistor Q2, Q4, or Q6, of the lower arm of the motor drive circuit 32A, the current detection value IA3d detected by the peak-hold circuit 39p of the current detection circuit 39A2 is not equal to or higher than the overcurrent threshold Voct, and the overcurrent determination signal Soc of high level is output to the AND circuit 71 from the overcurrent determination circuit 74.

On the other hand, the control operation device 31 outputs the gate signal Sg of high level to the AND circuit 71, when the power is turned on and no abnormality of the motor drive circuit 32A is detected by the abnormality detection unit 31a, whereas the control operation device 31 outputs the gate signal Sg of low level, when an abnormality of the motor drive circuit 32A is detected.

Thus, when the motor drive circuit 32A is in a normal state, the gate signal Sg of high level is output from the control operation device 31, and in addition, the current detection value IA3d detected by the peak-hold circuit 39p of the current detection circuit 39A2 is not equal to or higher than the overcurrent threshold Voct.

Hence, the overcurrent determination signal Soc of high level is output to the AND circuit 71 from the overcurrent determination circuit 74. Therefore, the output signal from the AND circuit 71 is high level and the field effect transistors QA1 to QA3 of the motor current cutoff unit 33A are controlled to the on state, and the motor currents Ia to Ic output from the motor drive circuit 32A are supplied to the phase motor windings La to Lc of the three-phase electric motor 12. The three-phase electric motor 12 generates the steering assistance force corresponding to the steering torque.

From the normal state of the motor drive circuit 32A, when a short-circuit failure occurs at any one of the field effect transistors Q2, Q4, and Q6 to be the lower arms of the motor drive circuit 32A, a short-circuit current flows at a time when the field effect transistors Q1, Q3, and Q5, to be the upper arms where a short-circuit failure occurs are in the on state. The short-circuit current is detected by the current detection circuit 39A, and is supplied to the overcurrent determination circuit 74 through the maximum value selection circuit 72. At this timing, as the current detection value IA3d to be input into the overcurrent determination circuit 74 is equal to or higher than the overcurrent threshold Voct, the overcurrent determination signal Soc of low level is output from the overcurrent determination circuit 74 to the AND circuit 71. Therefore, the output from the AND circuit 71 becomes the low level, and the field effect transistors QA1 to QA3 for the current cutoff of the motor current cutoff unit 33A and the field effect transistor QC of the power supply cutoff unit 44A are controlled to be in the off state. The motor currents Ia to Ic output to the three-phase electric motor 12 from the motor drive circuit 32A are cut off.

Further, while being held by the peak-hold circuit 39p, the cutoff state continues and the current detection value IA1d at the current detection circuit 39A1 and the current detection value IA2d at the current detection circuit 39A2 are zero. It is thus possible for the abnormality detection unit 31a to detect the value as an abnormality of the motor drive circuit 32A.

Thus, when the motor drive circuit 32A is in the overcurrent state, the overcurrent state can be detected immediately by the overcurrent-time cutoff circuits 70A and 70B configured with hardware. When the overcurrent state is detected, the cutoff operation of the motor current cutoff unit 33A or 33B can be carried out immediately, and the cutoff operation of the power supply cutoff unit 44A or 44B can be carried out immediately, too. Such an overcurrent state enables to certainly prevent the damage, caused by the overcurrent, of the field effect transistors Q1 to Q6 of the motor drive circuit 32A or 32B.

On the other hand, in order to diagnose whether or not the overcurrent-time cutoff circuits 70A and 70B operate normally, the diagnosis signal Sd including the diagnosis signals Sd1 and Sd2 to be a value larger than an overcurrent threshold Ioct through the amplifier 73 is alternately output to the motor drive circuits 32A and 32B, at every predefined timing from the abnormality diagnosis unit 31b of the control operation device 31 after the power is turned on, or at a timing when the state where the steering assistance carried out by the motor is not being operated is detected.

When the diagnosis signal Sd is output from the control operation device 31, the diagnosis signal Sd is selected by the maximum value selection circuit 72, and is supplied to the overcurrent determination circuit 74. In the overcurrent determination circuit 74, as the diagnosis signal Sd to be input is larger than the overcurrent threshold Ioct, the overcurrent determination signal Soc of low level is output to the AND circuit 71. Therefore, the output from the AND circuit 71 becomes the low level, the motor current cutoff unit 33A or 33B is controlled to be in the cutoff state, and the power supply cutoff unit 44A or 44B is controlled to be in the cutoff state. Accordingly, by confirming whether the motor-phase voltages V1ma to V1mc or V2ma to V2mc of the motor voltage detection circuit 40A or 40B are zero or the current detection values IA1d and IA2d or IB1d and IB2d of the current detection circuits 39A1 and 39A2 or 39B1 and 39B2 are zero, it is possible to diagnose whether or not the overcurrent-time cutoff circuits 70A and 70B operate normally.

Here, the diagnosis signal Sd is alternately supplied to the motor drive circuits 32A and 32B from the control operation device 31 at every predefined time. Therefore, the motor drive circuit 32A or 32B to which the diagnosis signal Sd is not supplied is capable of continuing the normal steering assistance control, so that a strange feel to be given to the driver during the diagnosis can be prevented. Alternatively, also by supplying the diagnosis signal Sd in the state where the steering assistance carried out by the motor is not being operated, a strange feel to be given to the driver can be prevented.

Figure 15:
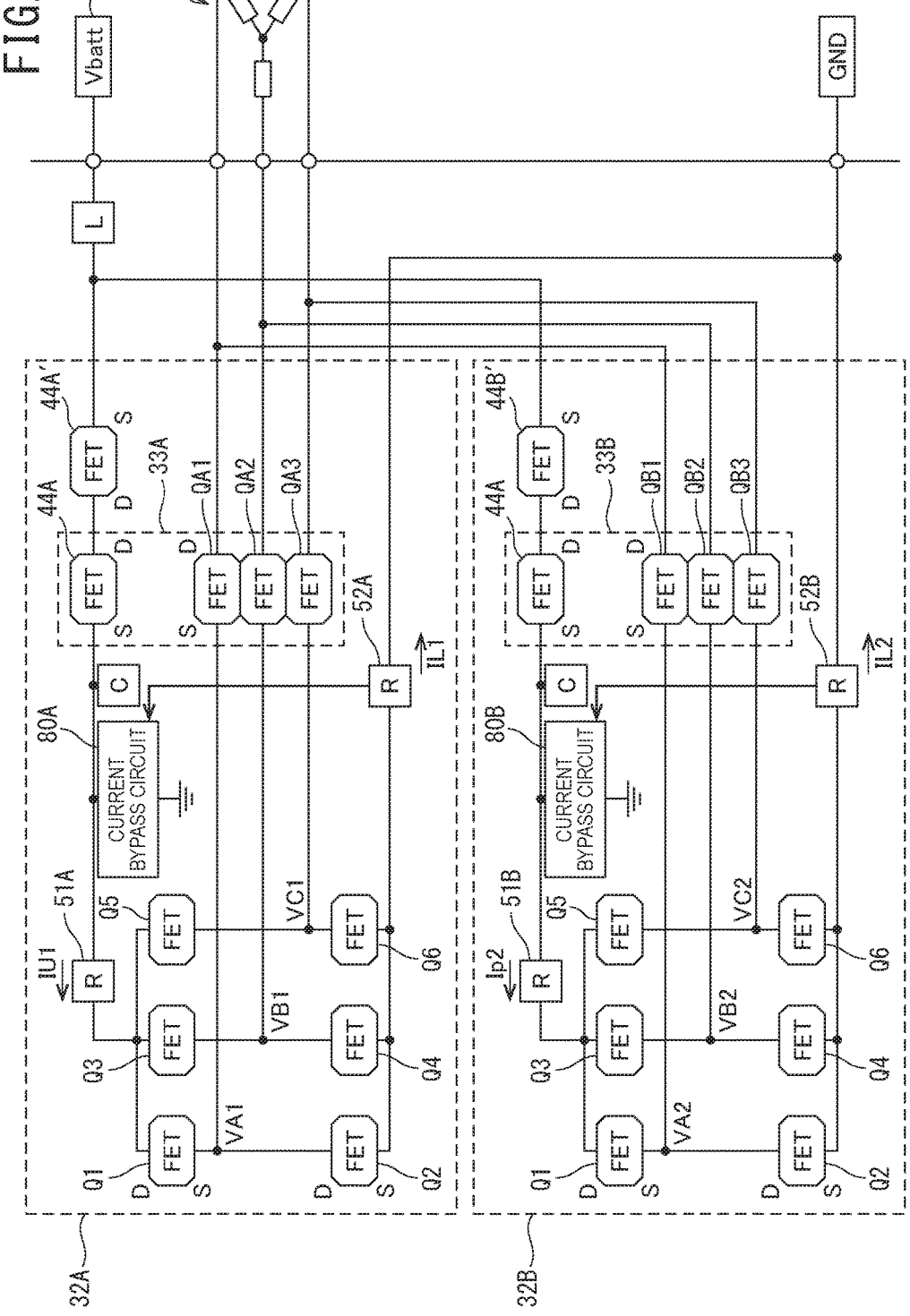
FIG. 15 is a block diagram illustrative of a current bypass circuit at the time of overcurrent.

In addition to this, in order to protect each of the field effect transistors Q1 to Q6 of the motor drive circuits 32A and 32B from the overcurrent state caused by the short-circuit abnormality of the lower arms of the motor drive circuits 32A and 32B, current bypass circuits 80A and 80B may be arranged between the power supply line and the ground, as illustrated in FIG. 15.

Figure 16:
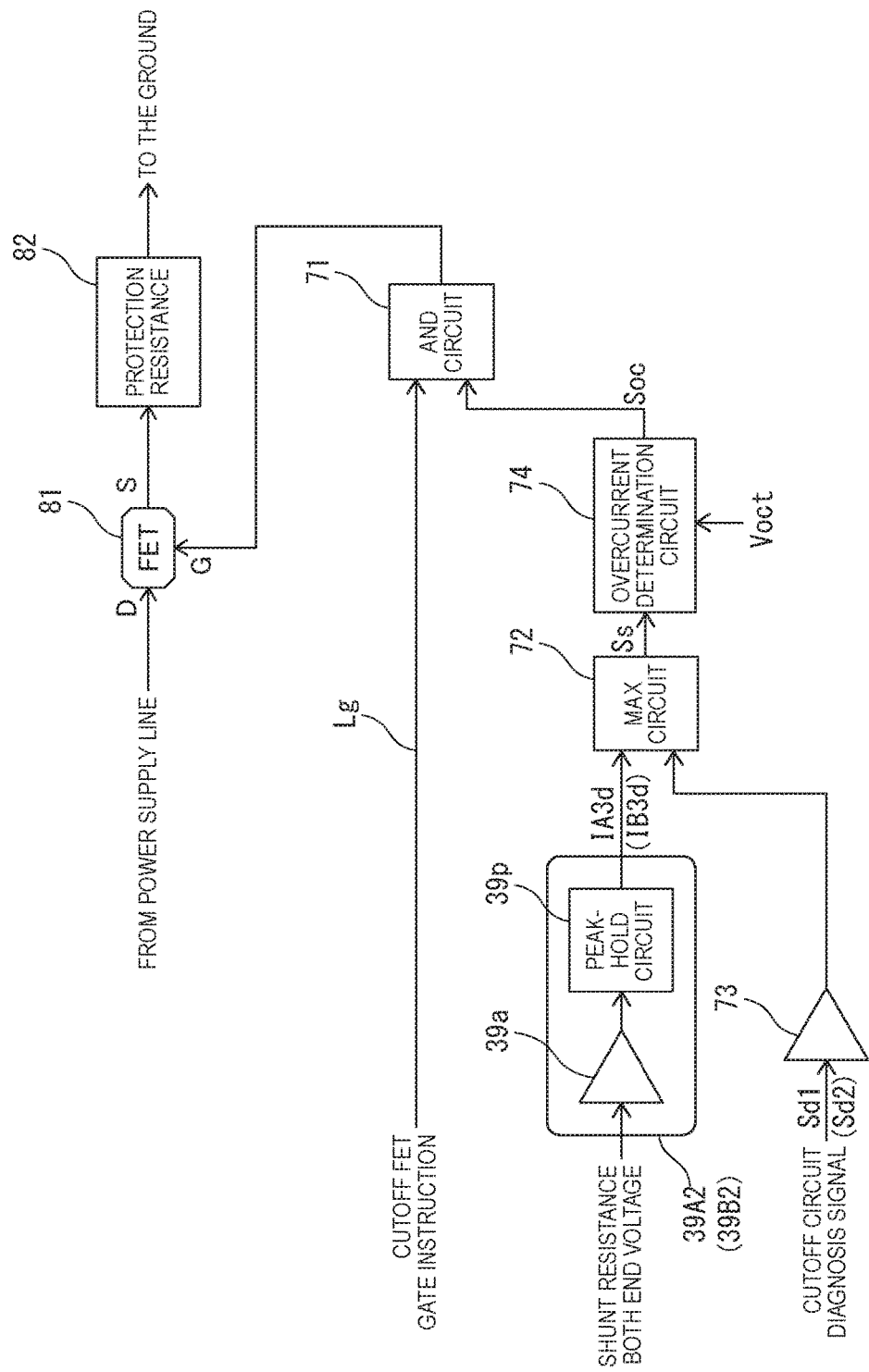
FIG. 16 is a block diagram illustrative of a specific configuration of the current bypass circuit.

Each of the current bypass circuits 80A and 80B, as illustrated in FIG. 16, has a series circuit of a field effect transistor 81 and a protection resistance 82 arranged between the power supply line Lp, over which the power from the battery 22 of the motor drive circuits 32A and 32B is supplied, and the ground. Here, the resistance value of the protection resistance 82 is set such that the current is so set as to the amount by which the field effect transistor 81 is not damaged when the field effect transistor 81 is in the on state and the overcurrent flows.

Then, the overcurrent determination signal Soc of the overcurrent determination circuit 74 having a similar configuration to that of FIG. 14 is input to the gate of the field effect transistor 81. Here, when the overcurrent state is determined, the overcurrent determination circuit 74 supplies the overcurrent determination signal Soc of high level to the base of the field effect transistor 81 and turns the field effect transistor 81 to be in the on state. When the overcurrent state is not determined, the overcurrent determination circuit 74 supplies the overcurrent determination signal Soc of low level to the base of the field effect transistor 81 and turns the field effect transistor 81 to be in the off state.

Thus, when the overcurrent determination circuit 74 determines that overcurrent is not occurring, the current bypass circuits 80A and 80B output the overcurrent determination signal Soc of low level to turn the field effect transistor 81 to be in the off state. Hence, the battery current supplied from the battery 22 is supplied to the motor drive circuits 32A and 32B, without being bypassed or reduced.

On the other hand, when the overcurrent determination circuit 74 determines that the overcurrent state is occurring, the current bypass circuits 80A and 80B output the overcurrent determination signal Soc of high level to turn the field effect transistor in the on state. Therefore, the current supplied from the battery 22 flows through the current bypass circuits 80A and 80B to the ground through a current protection resistance 83. The current amount to be supplied to the motor drive circuit 32A or 32B is reduced to certainly prevent the damage of the field effect transistor 81 and the field effect transistors Q1 to Q6 of the motor drive circuit 32A or 32B.

Figure 17:
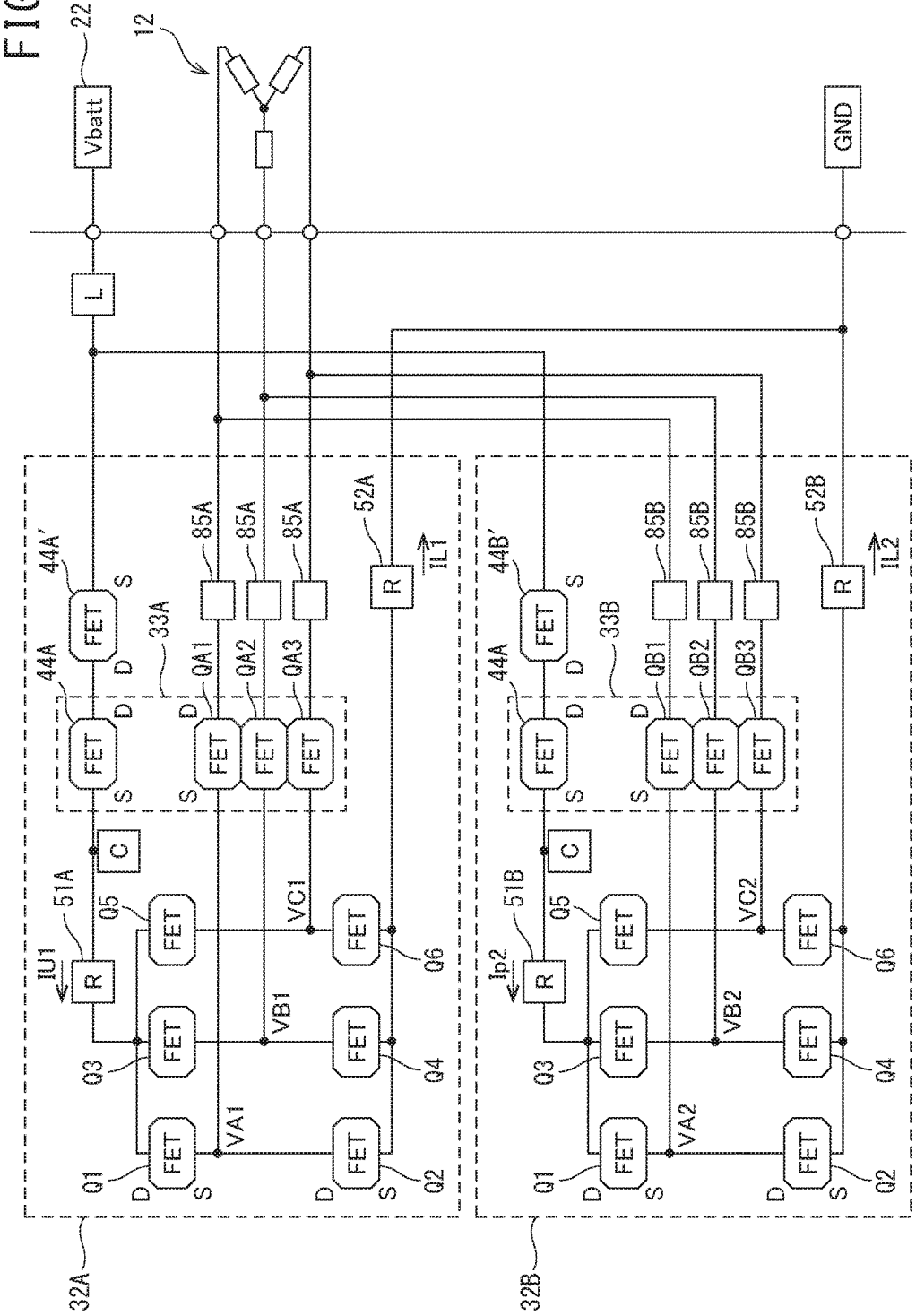
FIG. 17 is a block diagram illustrative of an example of a motor drive circuit having an overcurrent suppression unit.
Figure 18:
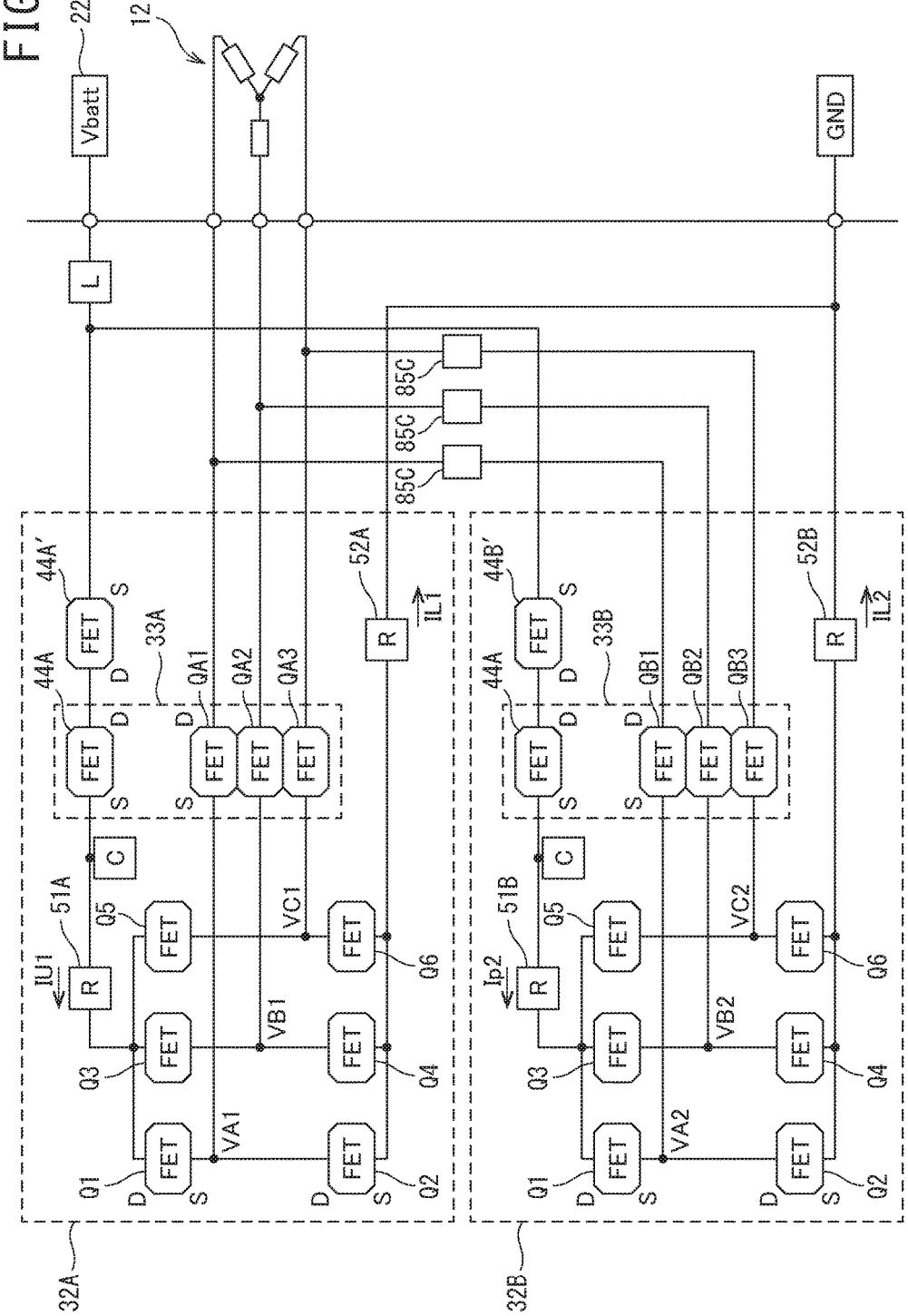
FIG. 18 is a block diagram illustrative of another arrangement example of the overcurrent suppression unit.

Further, in the configurations of FIG. 13 and FIG. 15, the overcurrent state is suppressed by using a switch unit. However, as illustrated in FIG. 17, overcurrent suppression units 85A and 85B including protection resistances or protection coils may be provided on the three-phase electric motor 12 side of the motor current cutoff units 33A and 33B in the motor drive circuits 32A and 32B. Here, the overcurrent suppression units 85A and 85B, as illustrated in FIG. 17, may be provided for both of the motor drive circuits 32A and 32B. As illustrated in FIG. 18, one set of overcurrent suppression units 85C may be arranged between the motor current cutoff units 33A and 33B.

Thus, by providing the overcurrent suppression units 85A and 85B, when a short-circuit abnormality occurs at one of the motor drive circuits 32A and 32B, the motor currents Ia to Ic flow into the motor drive circuit 32B (or 32A) where the short-circuit abnormality occurs from the motor drive circuit 32A (or 32B) that is normal, so that an affect given to the motor current to be supplied to the three-phase electric motor 12 can prevented with certainty. Here, when the motor drive circuits 32A and 32B are provided with the overcurrent suppression units 85A and 85B individually, circuit constants of the motor drive circuit 32A and 32B can be matched with each other. Hence, the circuit design is made easily without the need to consider an imbalance of the circuit constants at the time of designing the motor drive circuits 32A and 32B.

Figure 19:
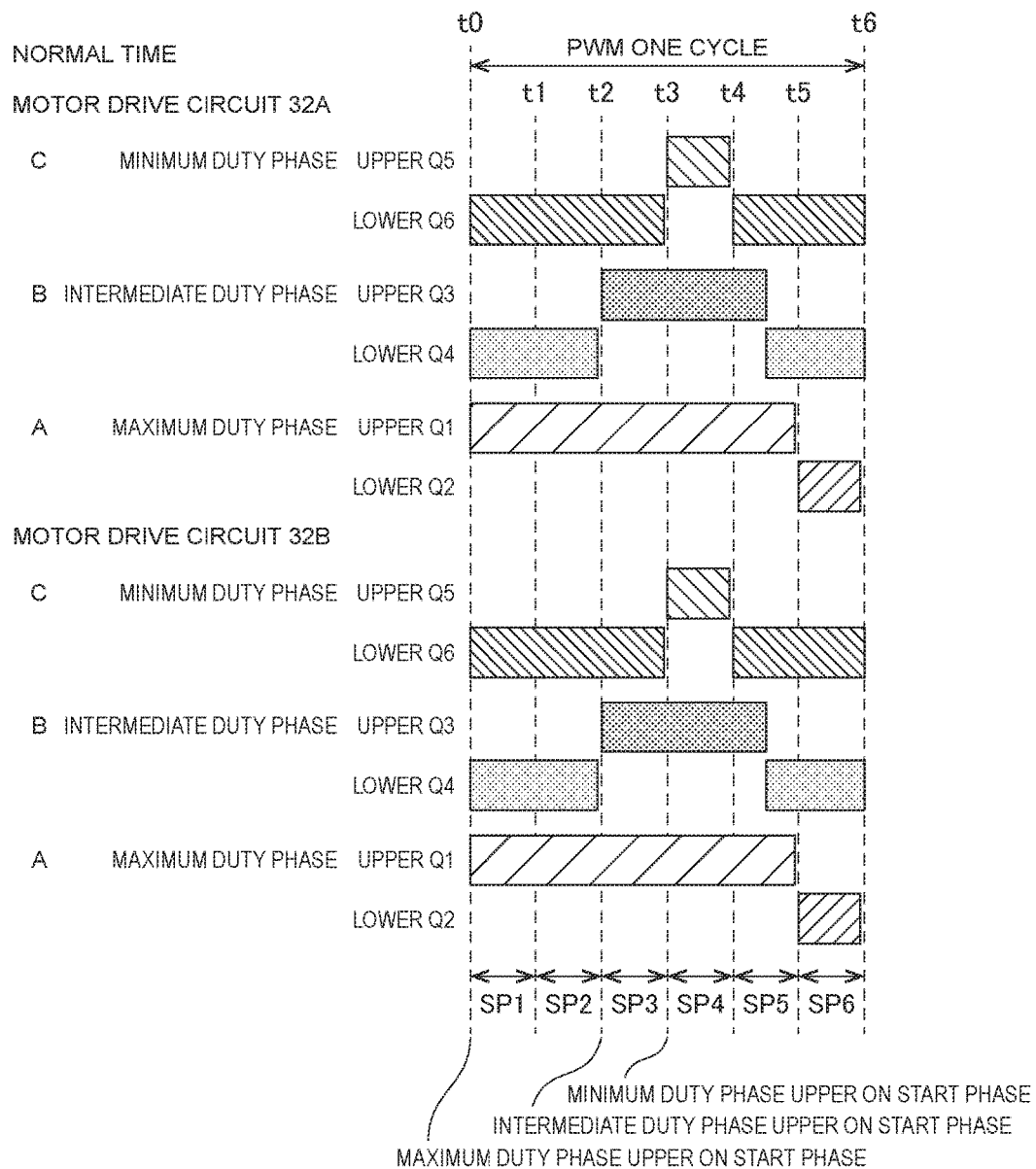
FIG. 19 is a waveform diagram illustrative of an example of a pulse width modulation signal to be supplied to each field effect transistor gate of the inverter circuit.

In addition, in the above-described embodiment, the current detection units of the current detection circuits 39A and 39B respectively include the shunt resistances 52A and 52B arranged between the connection point on the ground side of the switching arms SWAa to SWAc and SWBa to SWBc, and the ground. The voltages on both ends of the respective shunt resistances 52A and 52B are supplied to the operational amplifier 39a, an output signal from the operational amplifier 39a is subject to the sample-holding by a sample-hold circuit 39c through a noise filter 39b, and the sample-hold signal is converted into a digital signal by an A/D converter 31c. Then, FIG. 19 illustrates an example of a relationship between the sampling period at the A/D converter 31c and pulse width modulation signals of the field effect transistors Q1 to Q6 included in the motor drive circuits 32A and 32B. In FIG. 19, it is assumed that for example, the switching arms SWAa and SWBa be the largest duty phases, the switching arms SWAb and SWBb be intermediate duty phases, and the switching arms SWAc and SWBc be the smallest duty phases.

In this case, in the switching arms SWAa and SWBa to be the largest duty phases, the field effect transistor Q1 to be an upper arm is inverted to the on state from the off state at the start time point t0 of one cycle (for example, 50 μsec) of the pulse width modulation signal. Then, at the time point t2, the field effect transistor Q3 to be an upper arm of the switching arms SWAb and SWBb to be the intermediate duty phases is inverted to the on state from the off state. Subsequently, at the time point t3, the field effect transistor Q5 to be an upper arm of the switching arms SWAc and SWBc to be the smallest duty phases is inverted to the on state from the off state.

Then, the field effect transistor Q5 is inverted to the off state from the on state at the time point t4, and the field effect transistor Q3 is inverted to the off state from the on state at the time between points t4 and t5, then the field effect transistor Q1 is inverted to the off state from the on state at time point t5.

In order to form the gate signals of the respective field effect transistors Q1 to Q6 of the motor drive circuits 32A and 32B, the current detection values IA2d and IB2d output from the sample-hold circuit 39s are sampled and converted into digital signals in a sampling period SP1 between the time points t0 and t1 while the field effect transistor, for example, Q1 only on the upper arm side of a single phase is in the on state, and in a sampling period SP3 between the time points t2 and t3 while the field effect transistor on the upper arm side of a double phase is in the on state.

Then, the control operation device 31 utilizes the fact that the total motor current is zero, that is Ia+Ib+Ic=0, so that the respective phase motor currents Ia, Ib, and Ic can be detected. Therefore, the voltage instruction value operation unit 38 described above with reference to FIG. 6 calculates the current deviations ΔIa, ΔIb, and ΔIc based on the motor current instruction values Ia*, Ib*, and Ic* and the detected phase motor currents Ia, Ib, and Ic, and carries out the PI control process onto the calculation results to calculate the voltage instruction values V1* and V2*.

In addition, when an open failure of all of the field effect transistors Q1 to Q6 included in the motor drive circuits 32A and 32B is detected from the digital current detection signal that has been subjected to the A/D conversion by the A/D converter 31c included in the control operation device 31 and the steering wheel 1 is steered and the three-phase electric motor 12 is driven for rotation, the switching arms SWAa to SWAc and SWBa to SWBc to be the largest duty phases, the intermediate duty phases, and the smallest duty phases during one cycle of the pulse width modulation signal sequentially change. Hence, an open failure of each of the field effect transistors Q1 to Q6 can be detected by comparing the digital current detection values IA1d and IB1d and by further comparing IA2d and IB2d based on the sample-hold outputs, which have been sampled in the sampling periods SP1 and SP3, from the A/D converter 31c.

When the steering wheel 1, however, is in the steering holding state, the steering assistance torque is generated at the three-phase electric motor 12, but the three-phase electric motor 12 itself does not rotate. Thus, the largest duty phase, the intermediate duty phase, and the smallest duty phase in one cycle of the pulse width modulation signal are fixed in the state of FIG. 19, for example. Thus, in the state of FIG. 19, when an open failure occurs at any one of the field effect transistors Q2 to be the lower arms of the switching arms SWAa and SWBa to have the largest duty phases, or when an open failure occurs at any one of the field effect transistors Q5 to be the upper arms of the switching arms SWAc and SWBc to be the smallest duty phases, the open failure cannot be detected because the on state is not achieved in the sampling periods SP1 and SP3 of the A/D conversion circuit.

Accordingly, in the present embodiment, the sampling period SP4 between the time points t3 and t4 and the sampling period SP6 between the time points t5 and t6 are added to the sampling periods SP1 and SP3 at the A/D converter 31c, so that the digital current detection value is obtainable in the on state of the field effect transistor to be the lower arm of the largest duty phase and in the on state of the field effect transistor to be the upper arm of the smallest duty phase.

Thus, by comparing the digital current detection values IA1d and IB1d or IA2d and IB2d detected by the current detection circuits 39A1 and 39B1 or 39A2 and 39B2, it is possible to certainly detect the open failure of the field effect transistor to be the lower arm of the largest duty phase and the field effect transistor to be the upper arm of the smallest duty phase. The sampling periods SP4 and SP6 in an A/D conversion circuit 39d can be added when the steering wheel 1 is in the steering holding state, that is, when there is no change or a slight change in the rotational position detection value from the rotational position sensor 13a.

Figure 20:
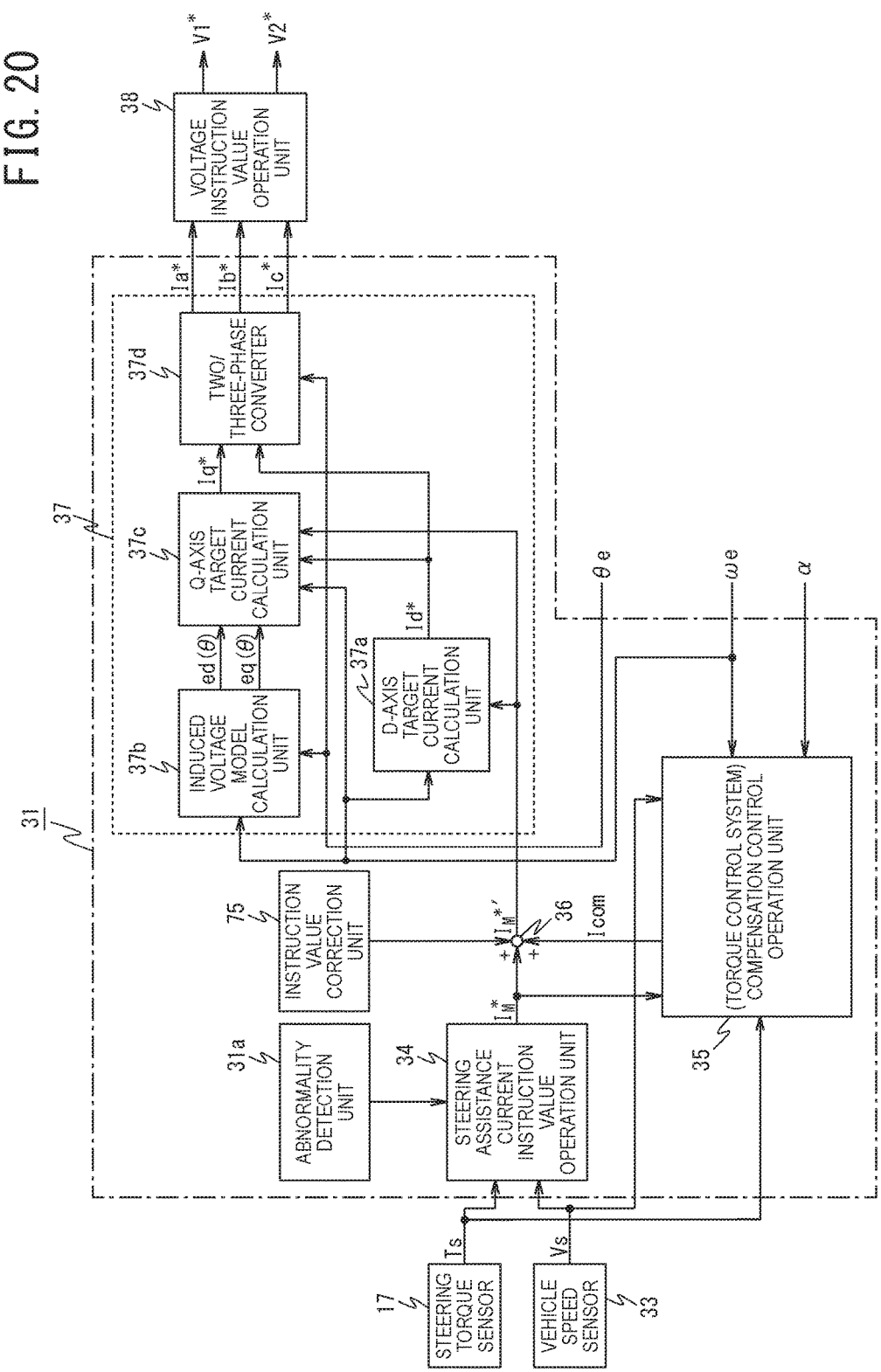
FIG. 20 is a block diagram illustrative of a motor slight movement circuit at a steering holding time.

For the reasons described above, instead of increasing the sampling period of the A/D conversion circuit 39d, when there is no change or a slight change in the rotational position detection value from the rotational position sensor 13a, for example, an instruction value correction unit 75 illustrated in FIG. 20 may output a slight movement correction value to the adder 36 to slightly move the three-phase electric motor 12 clockwise and counterclockwise to an extent not to give the driver a strange feel, so that the rotation stop state of the three-phase electric motor 12 by holding the steering does not occur.

In addition, in the above-described embodiment, the description has been given of the case where the abnormality detection unit 31a of the abnormality diagnosis unit 31b detects the open failure and the short-circuit failure at the switching elements Q1 to Q6 of the motor drive circuits 32A and 32B. However, the present invention is not limited to this. The abnormality diagnosis unit 31b may detect an operation abnormality of the motor current cutoff units 33A and 33B of the motor drive circuits 32A and 32B and the power supply cutoff units 44A and 44A', and 44B and 44B'.

Figure 21:
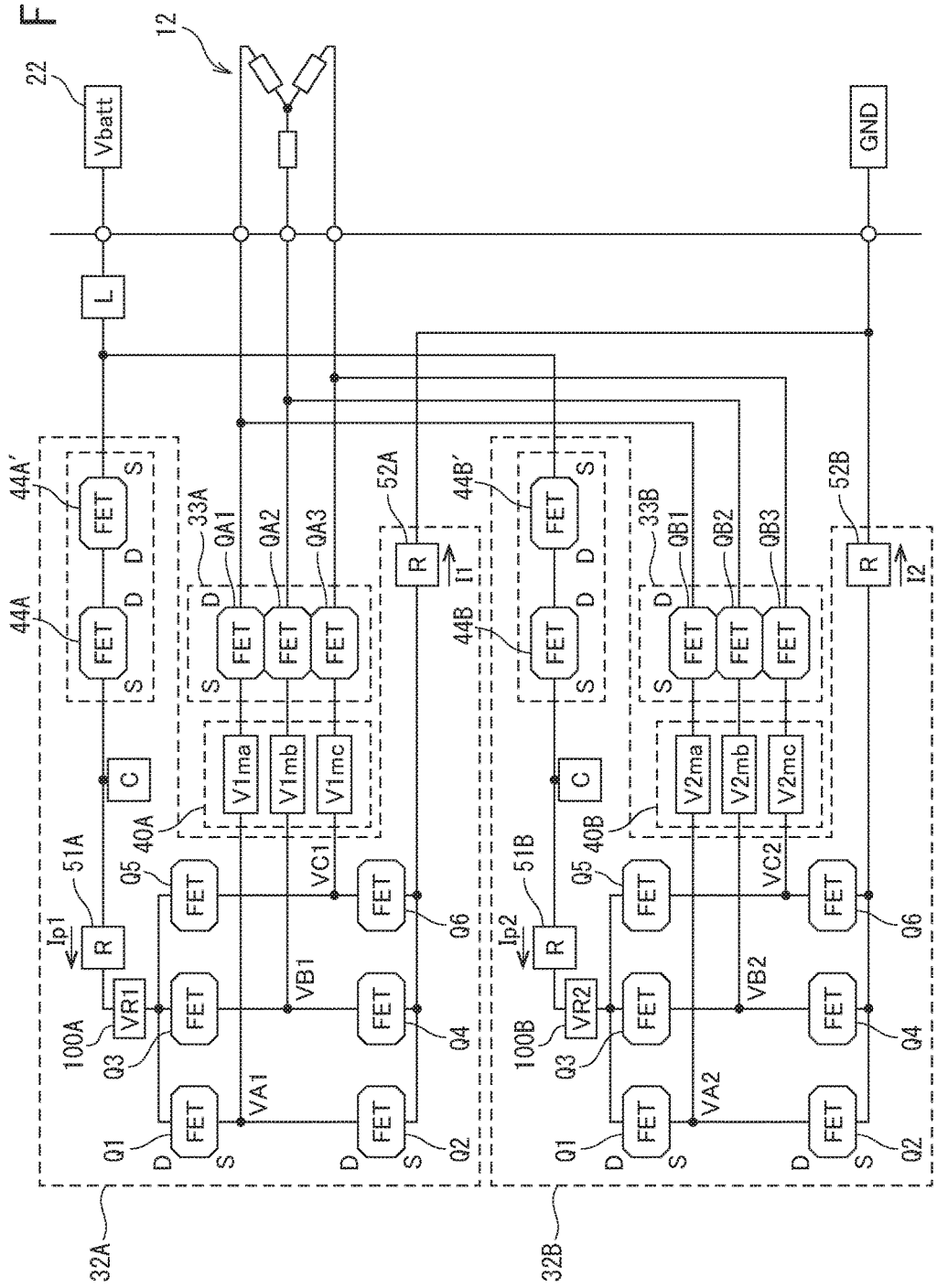
FIG. 21 is a block diagram illustrative of an example of the motor drive circuit having an input voltage detection circuit.

In this case, in the motor drive circuit 32A, as illustrated in FIG. 21, an input voltage detection circuit 100A detects an input voltage VR1 is arranged between the shunt resistance 51A and the field effect transistors Q1, Q3, and Q5. Similarly, in the motor drive circuit 32B, as illustrated in FIG. 21, an input voltage detection circuit 100B detects an input voltage VR2 is arranged between the shunt resistance 51B and the field effect transistors Q1, Q3, and Q5.

Figure 22:
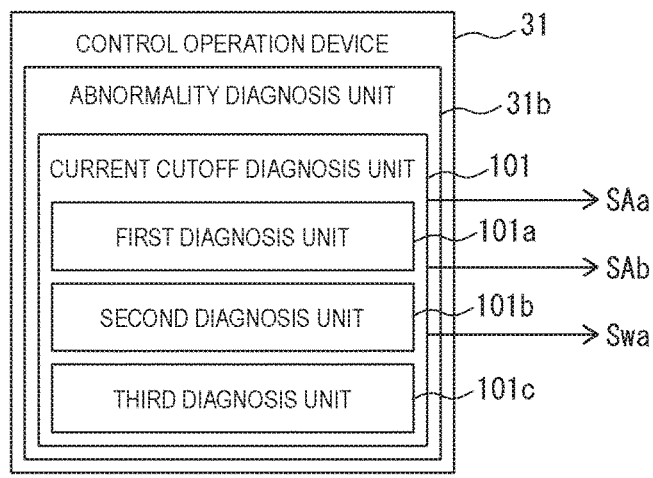
FIG. 22 is an outline configuration view illustrative of another example of an abnormal diagnosis unit of the control operation device.

Then, the abnormality diagnosis unit 31b of the control operation device 31, as illustrated in FIG. 22, includes a current cutoff diagnosis unit 101 and a drive state determination unit 102.

Then, the current cutoff diagnosis unit 101 includes a first diagnosis unit 101a, a second diagnosis unit 101b, and a third diagnosis unit 101c.

The first diagnosis unit 101a also serves as a motor current cutoff diagnosis unit, and temporarily turns the motor current cutoff unit 33A or 33B to be in the cutoff state to diagnose an operation state of the motor current cutoff unit 33A or 33B.

The second diagnosis unit 101b temporarily turns the power supply cutoff units 44A and 44A', or 44B and 44B' to be in the cutoff state to diagnose operation states of the power supply cutoff unit 44A and 44A', or 44B and 44B'.

The third diagnosis unit 101c temporarily turns the motor current cutoff unit 33A or 33B and the power supply cutoff units 44A and 44A' or 44B and 44B' to be in the cutoff state to diagnose operation states of the motor current cutoff unit 33A or 33B and the power supply cutoff units 44A and 44A' or 44B and 44B'.

Figure 23:
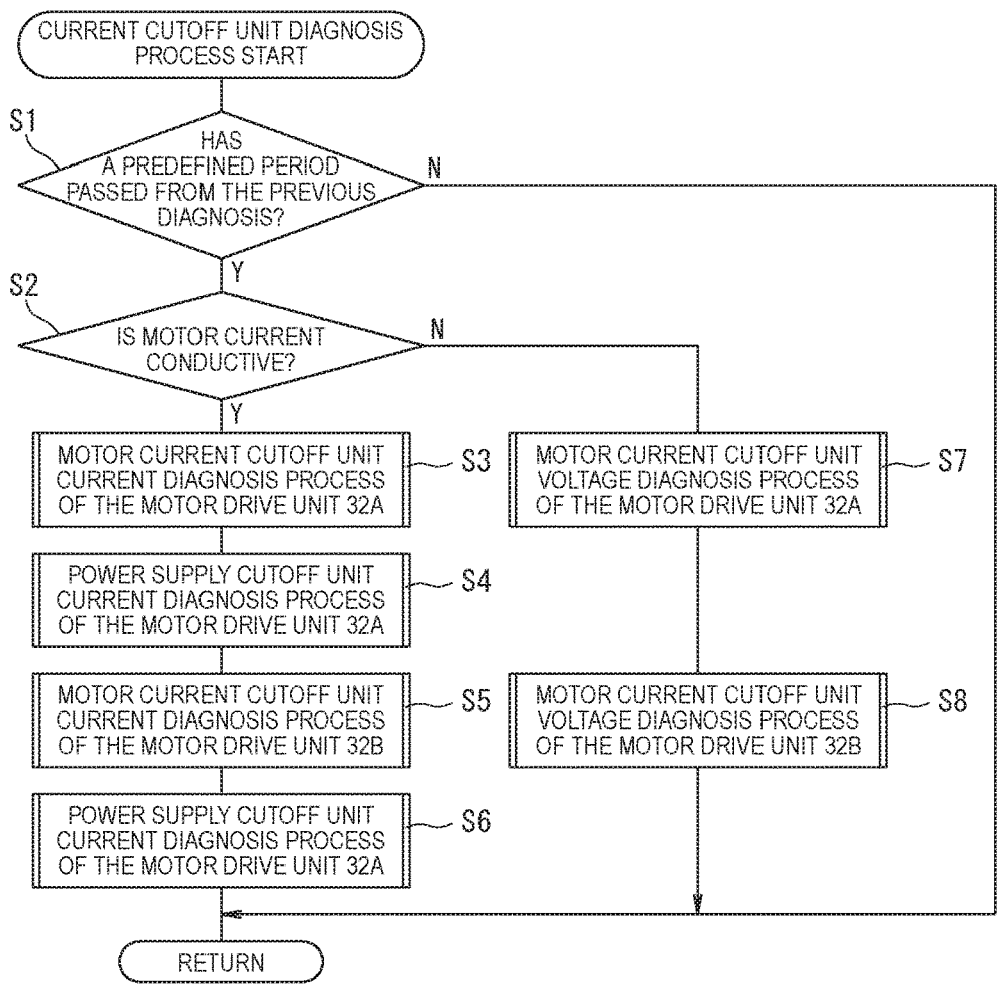
FIG. 23 is a flow chart illustrative of an example of the current cutoff diagnosis processing procedure to be carried out by the abnormality diagnosis unit of the control operation unit.

The abnormality diagnosis unit 31b of the control operation device 31, as illustrated in FIG. 23, carries out a current cutoff diagnosis process illustrated in FIG. 23 as a timer interruption process at every predefined time (for example, one second), in driving and controlling the three-phase electric motor.

In the current cutoff diagnosis process, firstly, in step S1, it is determined whether or not a predefined period (for example, one minute) has passed from the previous diagnosis time. When the predefined period has not passes, the current cutoff diagnosis process is finished without doing anything. When the predefined time has passed, the process goes to step S2.

In step S2, a high torque state where the motor currents Ia to Ic are flown across the three-phase electric motor 12, or a low torque state where the motor current is near "0" is determined. In this determination, the high torque state is determined when the absolute value of the current instruction value I* is equal to or larger than a predefined value, the absolute value of the maximum value of the phase current instruction values Ia* to Ic* is equal to or larger than a predefined value, and the current detection values Iad to Icd are equal to or larger than a predefined value. Otherwise, the low torque state is determined.

When the determination result of step S2 is the high torque state where the motor currents Ia to Ic flow, the process goes to step S3 in order to carry out a motor current cutoff unit current diagnosis process to diagnose an operation state of the motor current cutoff unit in the motor drive circuit 32A based on the upper current detection value IA1$d$ and the lower current detection value IA2$d$. Then, the process goes to step S4.

In step S4, a power supply cutoff unit current diagnosis process is carried out to diagnose operation states of the power supply cutoff units 44A and 44A' in the motor drive circuit 32A based on the upper current detection value IA1$d$ and the lower current detection value IA2$d$. Then, the process goes to step S5.

In step S5, a motor current cutoff unit current diagnosis process is carried out to diagnose an operation state of the motor current cutoff unit in the motor drive circuit 32B based on the upper current detection value IB1$d$ and the lower current detection value IB2$d$. Then, the process goes to step S6.

In step S6, a power supply cutoff unit current diagnosis process is carried out to diagnose operation states of the power supply cutoff units 44B and 44B' in the motor drive circuit 32B based on the upper current detection value IB1$d$ and the lower current detection value IB2$d$. Then, the timer interruption process is finished, and the process returns to a predefined main program.

The determination result of the above-described step S2 is the low torque state where the motor current does not flow or slightly flows, the process goes to step S7 in order to carry out a current cutoff unit voltage diagnosis process to diagnose operation states of the motor current cutoff unit 33A in the motor drive circuit 32A and the power supply cutoff units 44A and 44A' based on the input voltage VR1 detected by an input voltage detection unit 100A. Then, the process goes to step S8.

In step S8, the current cutoff unit voltage diagnosis process is carried out to diagnose operation states of the motor current cutoff unit 33B in the motor drive circuit 32B and the power supply cutoff units 44B and 44B' based on the input voltage VR2 detected by an input voltage detection unit 100B. Then, the timer interruption process is finished, and the process returns to the predefined main program.

Figure 24:
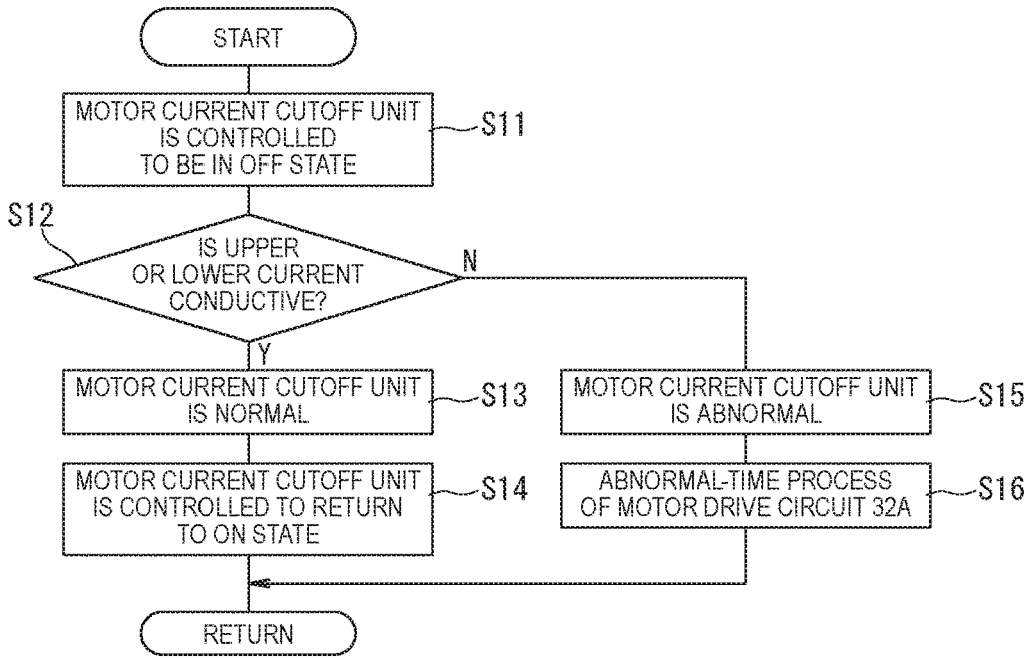
FIG. 24 is a flow chart illustrative of a specific process of the motor current cutoff unit current diagnosis process of FIG. 23.

Here, in the motor current cutoff unit current diagnosis process of step S3 in FIG. 23, as illustrated in FIG. 24, firstly in step S11, each of the field effect transistors QA1 to QA3 of the motor current cutoff unit 33A in the motor drive circuit 32A is controlled to be in the off state, and the process goes to step S12.

In step S12, the upper current detection values IA1$d$ and IA2$d$ of the current detection circuits 39A1 and 39A2 are read to determine a conductive state where the current is flowing or a non-conductive state.

When the determination result of step S12 is the non-conductive state, the process goes to step S13. It is determined that the field effect transistors QA1 to QA3 of the motor current cutoff unit 33A are normal, and then the process goes to step S14. Each of the field effect transistors QA1 to QA3 of the motor current cutoff unit 33A are returned to the on state, and then the process goes to step S4 of FIG. 22.

On the other hand, when the determination result of step S12 is the conductive state, the process goes to step S15. It is determined that a circuit-circuit failure occurs at one or more of the field effect transistors QA1 to QA3 of the motor current cutoff unit 33A, and then the process goes to step S16.

In step S16, an abnormal-time process to output the abnormality detection signal SAa of a logical value "1" to the gate drive circuit 41A is carried out in order to turn the field effect transistors Q1 to Q6 of the inverter circuit 42A to be in the off state, turn the field effect transistors QA1 to QA3 of the motor current cutoff unit 33A to be in the off state, and turn the field effect transistors included in the power supply cutoff units 44A and 44A' to be in the off state. Then, the process goes to step S4 of FIG. 23.

Thus, the steering assistance performance that compares well with that at the normal time can be brought out by using the motor drive circuit 32B that is normal same as the case where an abnormality of the motor drive circuit 32A is detected in the above-described embodiment.

In the process of FIG. 24, the determination of step S12 is not limited to the above-described operations, it may be determined whether or not the upper current detection value IA1$d$ and the lower current detection value IA2$d$ match each other.

It is to be noted that the process of FIG. 24 corresponds to the first diagnosis unit 101$a$.

Figure 25:
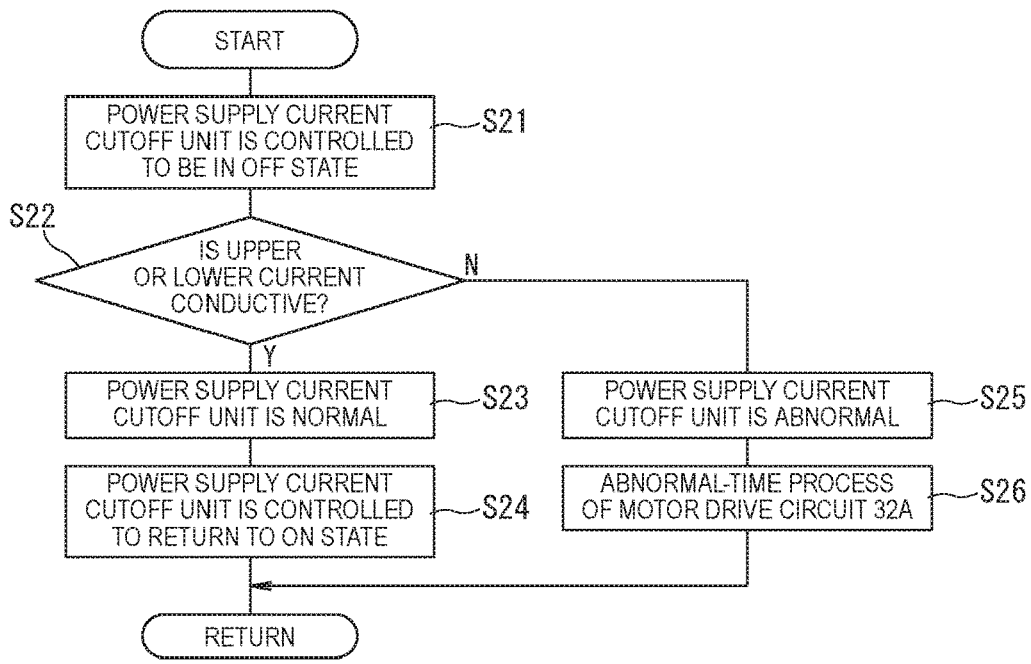
FIG. 25 is a flow chart illustrative of a specific process of a power supply cutoff unit current diagnosis process of FIG. 23.

In addition, in the power supply cutoff unit current diagnosis process of step S4 in FIG. 22, firstly in step S21, as illustrated in FIG. 25, the power supply cutoff units 44A and 44A' of the motor drive circuit 32A are controlled to the off state. Then, the process goes to step S22.

In step S22, the upper current detection values IA1$d$ and IA2$d$ of the current detection circuits 39A1 and 39A2 are read to determine the conductive state where the current is flowing or the non-conductive state.

When the determination result of step S22 is the non-conductive state, the process goes to step S23 to determine that the field effect transistors included in the power supply cutoff units 44A and 44A' are normal. Then, the process goes to step S24 to return each of the field effect transistors included in the power supply cutoff unit 44A and 44A' to the on state. Then, the process goes to step S5 of FIG. 22.

On the other hand, when the determination result of step S22 is the conductive state, the process goes to step S25 to determine that a short-circuit failure occurs at any one or both of the field effect transistors of the power supply cutoff units 44A and 44A'. Then, the process goes to step S26.

In step S26, the abnormality detection signal SAa of a logical value "1" is output to the gate drive circuit 41A, the abnormal-time process to output to the gate drive circuit 41A is carried out, the field effect transistors Q1 to Q6 of the inverter circuit 42A are turned to the off state, each of the field effect transistors QA1 to QA3 of the motor current cutoff unit 33A is turned to the off state, and the field effect transistors included in the power supply cutoff units 44A and 44A' are turned to the off state. Then, the process goes to step S5 of FIG. 23.

Thus, the steering assistance performance that compares well with that at the normal time can be provided by using the motor drive circuit 32B that is normal same as the case where an abnormality of the motor drive circuit 32A is detected in the above-described embodiment.

In the process of FIG. 25, the determination at step S22 is not limited to the above-described one, and it may be determined whether or not the upper current detection value IA1d and the lower current detection value IA2d match each other.

It is to be noted that the process of FIG. 25 corresponds to the second diagnosis unit 101b.

Also, as to the motor current cutoff unit current diagnosis process of step S5 of FIG. 23 and the power supply cutoff unit current diagnosis process of S6, the operation for the motor drive circuit 32A can be substituted for the operation for the motor drive circuit 32B in the processes of FIG. 24 and FIG. 25, and illustration in the drawing and detailed description are omitted.

Figure 26:
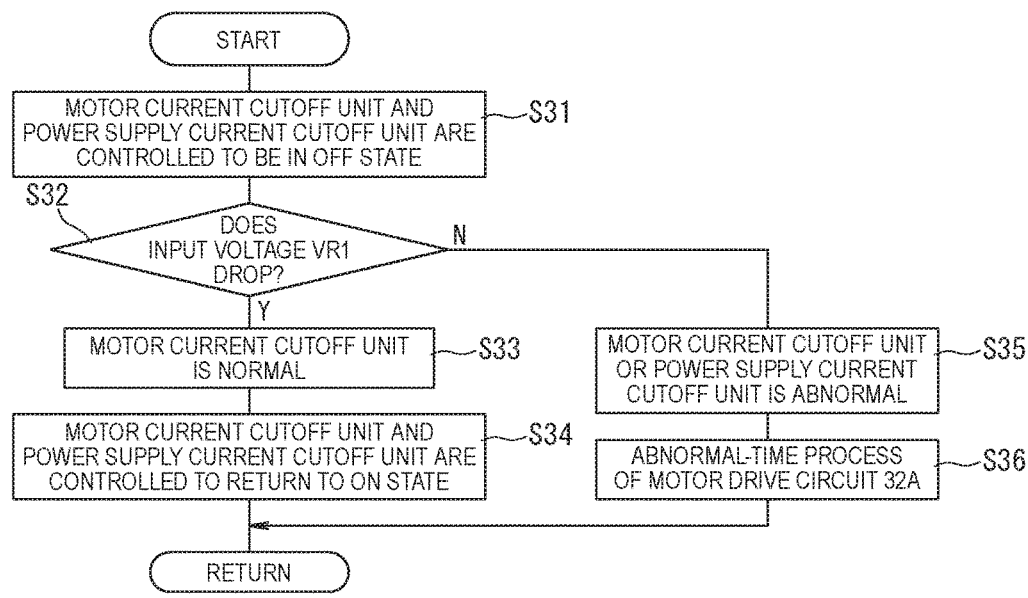
FIG. 26 is a flow chart illustrative of a specific process of a current cutoff unit voltage diagnosis process of FIG. 23.

Further, in the current cutoff unit voltage diagnosis process of step S7 in FIG. 23, firstly, in step S31, as illustrated in FIG. 26, each of the field effect transistors QA1 to QA3 of the motor current cutoff unit 33A in the motor drive circuit 32A is made to the off state, and the field effect transistors included in the power supply cutoff units 44A and 44A' are made to the off state. Then, the process goes to step S32.

In step S32, the input voltage VR1 detected by the input voltage detection unit 100A is read to determine whether or not the input voltage VR1 drops.

When the input voltage VR1 drops in the determination result of step S32, the process goes to step S33 to determine each of the field effect transistors QA1 to QA3 of the motor current cutoff unit 33A is normal, and the field effect transistors included in the power supply cutoff units 44A and 44A' are normal. Then, the process goes to step S34.

In step S34, each of the field effect transistors QA1 to QA3 of the motor current cutoff unit 33A in the motor drive circuit 32A and the field effect transistors included in the power supply cutoff units 44A and 44A' are both returned to the on state. Then, the process goes to step S8 of FIG. 23.

On the other hand, in the determination result of step S32, the input voltage VR1 does not drop, the process goes to step S35 to determine that a short-circuit failure occurs at one or more of the field effect transistors QA1 to QA3 of the motor current cutoff unit 33A, or a short-circuit failure occurs at the power supply cutoff unit 44A. Then, the process goes to step S36.

In step S36, similarly to step S16 of the above-described FIG. 24, the abnormality detection signal SAa of a logical value "1" is output to the gate drive circuit 41A, the abnormal-time process to output to the gate drive circuit 41A is carried out, the field effect transistors Q1 to Q6 of the inverter circuit 42A are turned to the off state, each of the field effect transistors QA1 to QA3 of the motor current cutoff unit 33A is turned to the off state, and the field effect transistors included in the power supply cutoff units 44A and 44A' are turned to the off state. Then, the process goes to step S8 of FIG. 23.

Thus, the steering assistance performance that compares well with that at the normal time can be brought out by using the motor drive circuit 32B that is normal same as the case where an abnormality of the motor drive circuit 32A is detected in the above-described embodiment.

In the process of FIG. 26, the determination process of step S32 is not limited to the case of determining the drop of the input voltage VR1, and it may be determined that the input voltage VR1 is lower than the input voltage VR2 of the motor drive circuit 32B, or is lower than the power supply voltage of the battery 22.

The process of FIG. 26 corresponds to the third diagnosis unit 101c.

In addition, as to the current cutoff unit voltage diagnosis process of step S8 of FIG. 23, the operation for the motor drive circuit 32A can be substituted for the operation for the motor drive circuit 32B in the processes of FIG. 26, and illustration in the drawing and detailed description are omitted.

Thus, when a short-circuit failure occurs at any one of the motor current cutoff units 33A and 33B and the power supply cutoff units 44A, 44A', 44B, and 44B', the motor current cutoff unit 33A or 33B of the motor drive circuit 32A or 32B and the power supply cutoff units 44A and 44A' or 44B and 44B' can be cut off in the current cutoff abnormality diagnosis process to be carried out by the abnormality diagnosis unit 31b. Thus, according to the configurations of FIG. 21 to FIG. 26, the steering assistance performance that compares well with that at the normal time can be brought out by using the motor drive circuit 32B that is normal same as the case where an abnormality of the motor drive circuit 32A is detected in the above-described embodiment. In this situation, when the abnormality of the motor drive circuit 32A is detected, the alarm signal Swa is output to the alarm circuit 50. Then, the abnormality of the motor drive circuit 32B is informed to a driver so as to encourage the driver to stop at the nearest service station.

It is to be noted that in the abnormality diagnosis process of FIG. 21 to FIG. 26, the description has been given of the case where the motor current cutoff unit current diagnosis process, the power supply cutoff unit current diagnosis process, and the current cutoff unit voltage diagnosis process. The present invention, however, is not limited to this. One or two of the motor current cutoff unit current diagnosis process, the power supply cutoff unit current diagnosis process, or the current cutoff unit voltage diagnosis process may be carried out for each of the motor drive circuits 32A and 32B.

In addition, in the above-described embodiment, the case where the current detection circuits 39A and 39B detect the motor current for every inverter circuit by using the two shunt resistances 51A and 52A, and 51B and 52B. The present invention, however, is not limited to this. In other words, in the present invention, the shunt resistance may be individually arranged on the ground side of each phase of the switching arms SWAa to SWAc and SWBa to SWBc of the motor drive circuits 32A and 32B to detect the motor current of each phase, or one of the three shunt resistances may be omitted to calculate and operate the motor current of the omitted phase.

In addition, in the above-described embodiment, the case where the control operation device 31 includes the A/D converter 31c has been described. The present invention, however, is not limited to this. The A/D conversion unit may be arranged on the output side of the current detection circuits 39A1, 39A2, 39B1, and 39B2.

In addition, in the above-described embodiment, the case where the motor rotational angle detection circuit 13 including the resolver has been described. However, also as to the motor rotational angle detection circuit 13, the back-up control is carried out as illustrated in FIG. 27.

Figure 27:
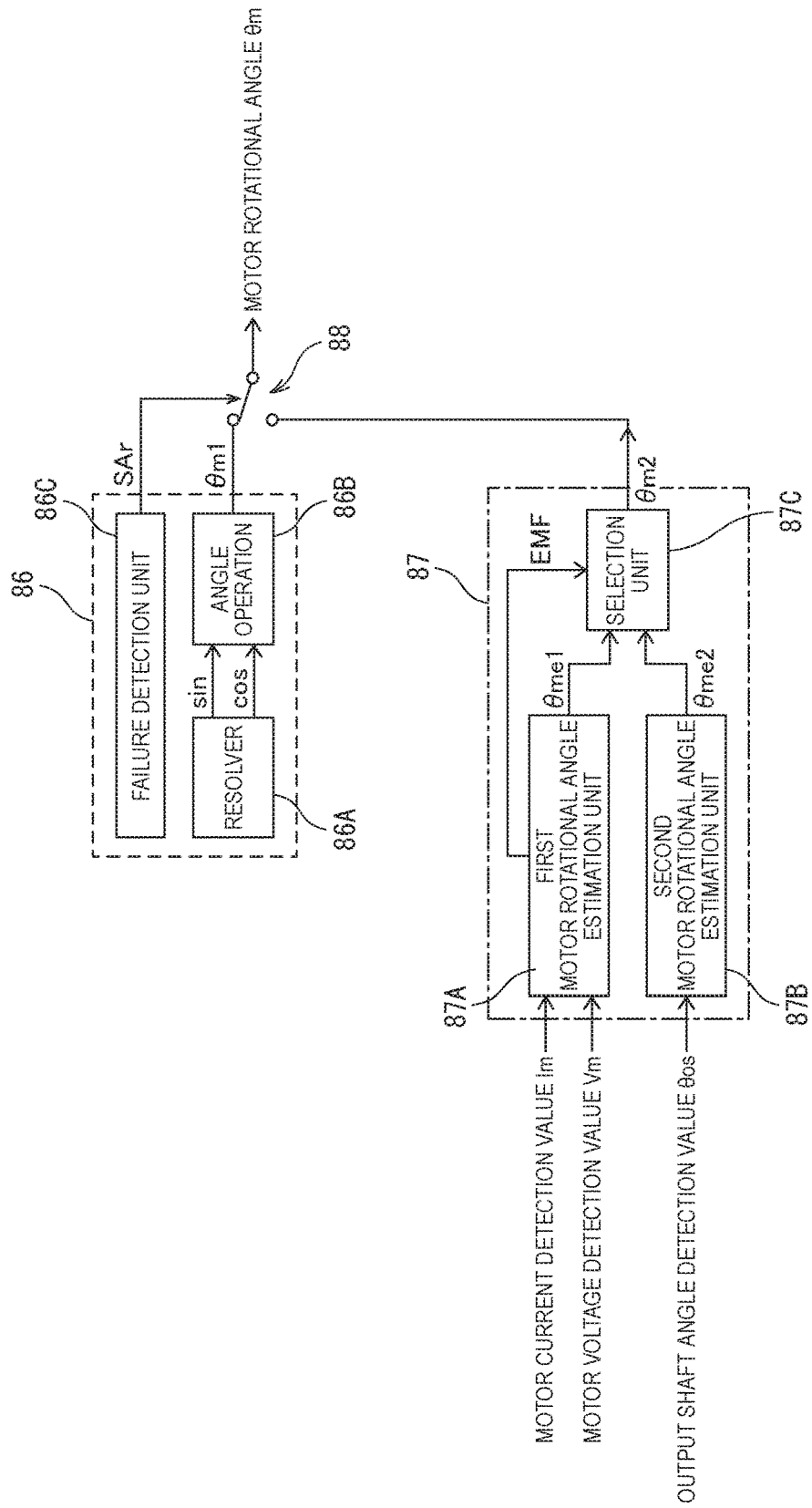
FIG. 27 is a block diagram illustrative of another example of the motor rotational angle detection circuit.

In other words, the specific configuration of the motor rotational angle detection circuit 13, as illustrated in FIG. 27, includes a main motor rotational angle detection circuit 86, a sub motor rotational angle detection circuit 87, and a rotational angle selection unit 88 that selects the motor rotational angles θm1 and θm2 respectively output from the main motor rotational angle detection circuit 86 and the sub motor rotational angle detection circuit 87.

The main motor rotational angle detection circuit 86 includes a resolver 86A that detects a rotational angle of the three-phase electric motor 12, an angle operation unit 86B that operates a motor rotational angle θm based on a sin signal and a cos signal according to the rotational angle of the three-phase electric motor 12 output from the resolver 86A, and an abnormality detection unit 86C that detects an abnormality of the resolver 86A and the angle operation unit 86B and to output an abnormality detection signal SAr.

In addition, the sub motor rotational angle detection circuit 87 receives a motor current detection value Im, a motor voltage detection value Vm, and an output shaft angle detection signal θos output from the output side rotational angle sensor 3c in FIG. 2 as described above.

The sub motor rotational angle detection circuit 87 includes a first motor rotational angle estimation unit 87A that calculates the back electromotive voltage EMF based on the motor current detection value Im and the motor voltage detection value Vm, and to estimate the motor rotational angle θm based on the calculated back electromotive voltage EMF, a second motor rotational angle estimation unit 87B that estimates the motor rotational angle θm based on the output shaft angle detection signal θos, and a selection unit 87C that selects a motor rotational angle estimation values θme1 and θme2 of the first motor rotational angle estimation unit 87A and the second motor rotational angle estimation unit 87B.

Here, the selection unit 87C receives the back electromotive voltage EMF calculated by the first motor rotational angle estimation unit 87A. When the back electromotive voltage EMF is equal to or larger than a predefined threshold, the selection unit 87C selects the motor rotational angle estimation value θme1 estimated by the first motor rotational angle estimation unit 87A, whereas when the back electromotive force EMF is smaller than the predefined threshold, the selection unit 87C selects the motor rotational angle estimation value θme2 estimated by the second motor rotational angle estimation unit 87B to output as the motor rotational angle θm2.

In addition, when the abnormality detection signal SAr output from the abnormality detection unit 86C of the main motor rotational angle detection circuit 86 has a logical value "0" representing that there is no abnormality, the rotational angle selection unit 88 selects the motor rotational angle θm1 output from the main motor rotational angle detection circuit 86, and outputs to the control operation device 31 as described above, as the motor rotational angle θm. When the abnormality detection signal SAr has a logical value "1" representing that there is an abnormality, the rotational angle selection unit 88 selects the motor rotational angle 8m2 output from the sub motor rotational angle detection circuit 87, and outputs to the control operation device 31, as the motor rotational angle θm.

As described above, the motor rotational angle detection circuit 13 includes the main motor rotational angle detection circuit 86, the sub motor rotational angle detection circuit 87, and the rotational angle selection unit 88. When the main motor rotational angle detection circuit 86 is normal, the motor rotational angle θm1 with high accuracy output from the main motor rotational angle detection circuit 86 is output to the control operation device 31 as the motor rotational angle θm. Then, when an abnormality occurs at the main motor rotational angle detection circuit 86, the motor rotational angle estimation value θme1 or θme2 estimated by the sub motor rotational angle detection circuit 87 is output to the control operation device 31, as the motor rotational angle θm.

Further, in a state where the motor rotational speed is high, that is the back electromotive voltage EMF generated at the motor windings La to Lc of the three-phase electric motor 12 is equal to or larger than a predefined threshold, the sub motor rotational angle detection circuit 87 selects the motor rotational angle estimation value θme1 estimated by the first motor rotational angle estimation unit 87A that estimates the motor rotational angle based on the back electromotive voltage EMF. In a state where the motor rotational speed is low, that is the back electromotive voltage EMF is smaller than the predefined threshold, the sub motor rotational angle detection circuit 87 selects the motor rotational angle estimation value θme2 estimated by the second motor rotational angle estimation unit 87B based on the output shaft angle detection signal θos, because the estimation accuracy of the motor rotational angle estimation value θme1 that is estimated based on the back electromotive force EMF degrades.

Accordingly, when an abnormality occurs at the main motor rotational angle detection circuit 86, the sub motor rotational angle detection circuit 87 is capable of obtaining the motor rotational angle while ensuring the demanded minimum accuracy.

In addition, in the above-described embodiment, the steering torque sensor 3 includes the input side rotational angle sensor 3b and the output side rotational angle sensor 3c as illustrated in FIG. 2. Hence, by providing a steering angle sensor 91 on the input shaft 2a side as illustrated in FIG. 2, it is possible to detect the absolute steering angle θab based on the steering angle detection signal θs of the steering angle sensor 91 and the output shaft angle detection signal θos detected by the output side rotational angle sensor 3c.

Figure 28A:
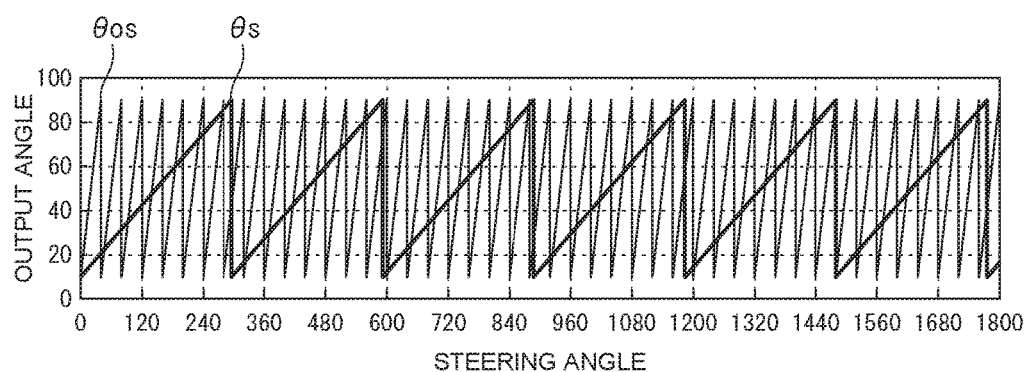
FIG. 28A and FIG. 28B are views illustrative of a calculation procedure of an absolute steering angle.
Figure 28B:
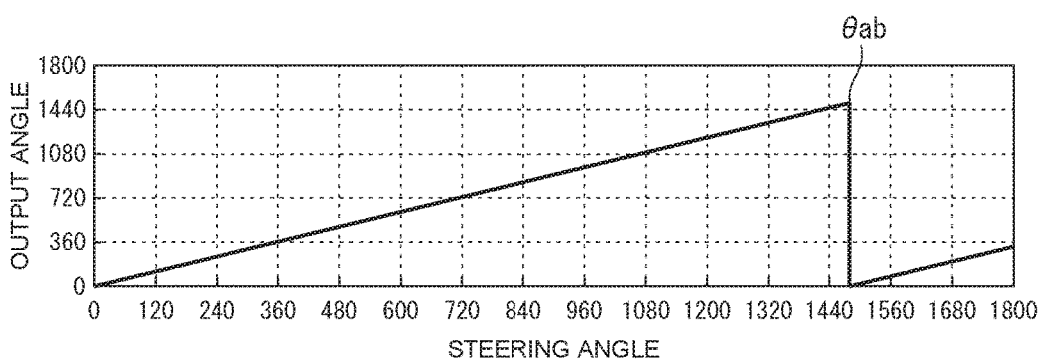

In other words, the steering angle sensor 91, as illustrated in FIG. 28A, outputs the steering angle detection signal θs of dentate wave of 296-deg cycle of the steering wheel 1, and outputs the output shaft angle detection signal θos of dentate wave of 40-deg cycle of the output shaft 2b detected by the output side rotational angle sensor 3c. The steering angle becomes 1480 deg when the steering angle detection signal θs and the output shaft angle detection signal θos match each other. Then, a vernier operation is carried out to find where (from the first to the 37th) the output shaft angle detection signal θos is located within the steering angle detection signal θs that is 1480 deg, so as to obtain the absolute steering angle θab, as illustrated in FIG. 28B.

Figure 29:
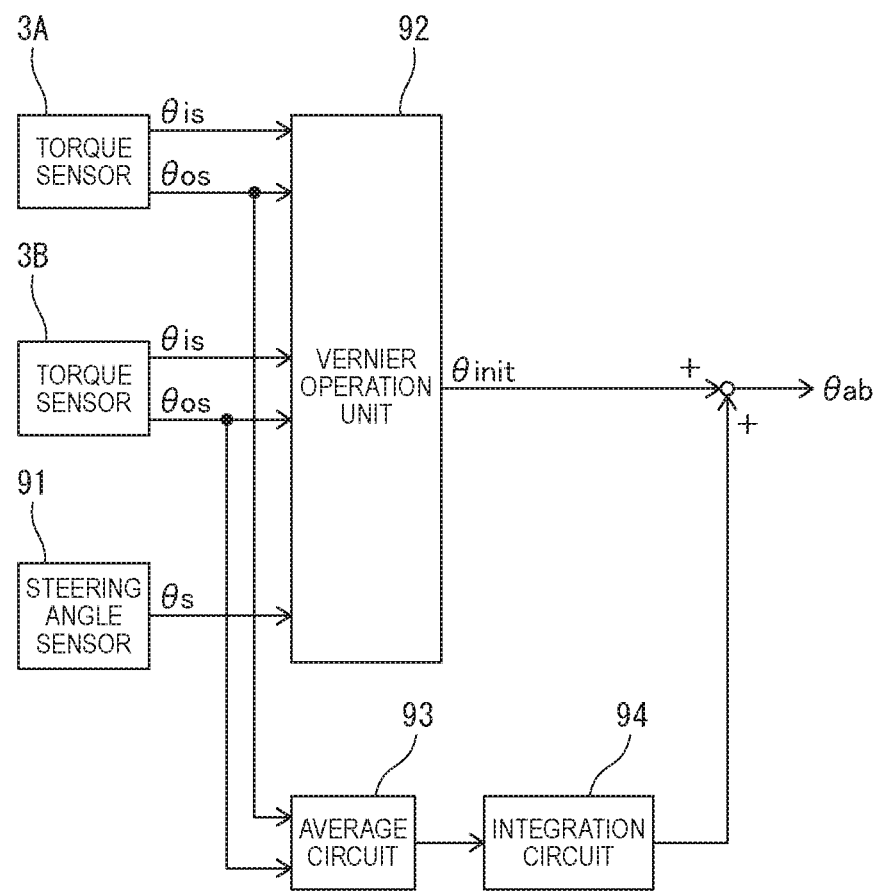
FIG. 29 is a block diagram illustrative of an absolute steering angle calculation circuit.

To this purpose, as illustrated in FIG. 29, torque sensors 3A and 3B of two systems are provided, the input shaft rotational angle detection signal θis and the output shaft rotational angle detection signal θos respectively output from the torque sensors 3A and 3B are supplied to the vernier operation unit 92, and the steering angle detection signal θs detected by the steering angle sensor 91 is supplied the vernier operation unit 92. Immediately after the ignition switch turns into the on state, the vernier operation unit 92 carries out the vernier operation once to calculate an initial steering angle θinit. Further, an average circuit 93 averages the output shaft angle detection signals θos output from the torque sensors 3A and 3B to calculate an average value. An integration circuit 94 integrates a change amount of the average value to calculate an integration value, and adds the calculated integration value to the initial steering angle θinit calculated by the vernier operation unit 92 to calculate the absolute steering angle θab.

In the above-described embodiment, the case where the electric motor is the three-phase electric motor has been described. The present invention, however, is not limited to this. The present invention is applicable to four- or more phase electric motor.

In addition, in the above-described embodiment, the case where the motor controller is applied to the electric power steering device has been described. However, the present invention is not limited to this. The present invention is applicable to any system using the electric motor, such as an electric brake device, a steer by wire system, a motor drive device for vehicle travelling, and the like.

According to one aspect of the present invention, there is provided a motor controller including: a plurality of hardware sets configured to operate in a normal state and to output a motor current; a control operation device configured to control the plurality of hardware sets commonly; an electric motor configured to operate with motor current output from each of the plurality of hardware sets; and an abnormality diagnosis unit configured to diagnose an abnormality of each of the plurality of hardware sets, wherein when there is an abnormal hardware set that has been diagnosed by the abnormality diagnosis unit, the control operation device stops an operation of the abnormal hardware set that has been diagnosed, and continues driving of the electric motor with a normal hardware set.

In the above-described motor controller, the abnormality diagnosis unit may include an abnormality detection unit capable of identifying an abnormality occurring point in the plurality of hardware sets.

In the above-described motor controller, the abnormality diagnosis unit may include an abnormality detection unit capable of identifying whether a difference in output value between the plurality of hardware sets is a variation or the abnormality.

In the above-described motor controller, the abnormality diagnosis unit may include a hardware state change amount operation unit configured to calculate a state change amount of a hardware set from a difference in detection value detected at the plurality of hardware sets or a difference between the detection value detected at the plurality of hardware sets and a threshold, the control operation device may determine that the state change amount falls within the variation, when the state change amount of the hardware set is smaller than a predefined value, and the control operation device may change a control parameter for the plurality of hardware sets depending on the state change amount of the hardware set, when the state change amount of the hardware set is equal to or larger than the predefined value.

According to another aspect of the present invention, there is provided a motor controller that drives and controls a multiphase electric motor, the motor controller including: a plurality of motor drive circuits configured to supply multiphase motor drive current to multiphase motor windings of the multiphase electric motor; a control operation device configured to drive and control the plurality of motor drive circuits; a plurality of motor current cutoff units respectively arranged between the plurality of motor drive circuits and the multiphase motor windings; and an abnormality detection unit configured to detect an abnormality of at least one of the plurality of motor drive circuits. When the abnormality detection unit does not detect the abnormality, the control operation device controls the plurality of motor drive circuits to supply the multiphase motor drive current to the multiphase motor windings, and when the abnormality detection unit detects the abnormality, the control operation device cuts off any of the plurality of motor current cutoff units connected to any of the plurality of motor drive circuits where the abnormality occurs.

According to yet another aspect of the present invention, there is provided a motor controller that drives and controls a multiphase electric motor, the motor controller including: a plurality of motor drive circuits configured to supply multiphase motor drive current to multiphase motor windings of the multiphase electric motor; a control operation device configured to drive and control the plurality of motor drive circuits; a plurality of motor current cutoff units respectively arranged between the plurality of motor drive circuits and the multiphase motor windings; and an abnormality detection unit configured to detect an abnormality of at least one of the plurality of motor drive circuits and the plurality of multiphase electric motor. In the multiphase electric motor, the multiphase motor windings that are wound around a stator are respectively connected in parallel with a plurality of coil units, when the abnormality detection unit does not detect the abnormality, the control operation device controls the plurality of motor drive circuits to supply the multiphase motor drive current to the multiphase motor windings, and when the abnormality detection unit detects the abnormality, the control operation device changes a drive mode of driving the plurality of motor drive circuits depending on an abnormality mode.

In the above-described motor controller, each of the plurality of motor drive circuits may include a multiphase inverter circuit having at least one upper arm and at least one lower arm having a number of arms corresponding to the number of phases of the multiphase electric motor, and configured to supply the multiphase (motor) drive current to the multiphase electric motor, and the abnormality detection unit may detect at least one of an open failure or a short-circuit failure of the at least one upper arm and the at least one lower arm included in the plurality of motor drive circuits.

In the above-described motor controller, when the abnormality detection unit detects at least one of the open failure or the short-circuit failure of the at least one upper arm and the at least one lower arm of any one of the plurality of motor drive circuits, the control operation device may cut off the multiphase motor current at one of the plurality of motor current cutoff units connected to one of the plurality of motor drive circuits in which the abnormality is detected, and may change a control mode of controlling the multiphase motor current of the other one the plurality of motor drive circuits that is normal.

In the above-described motor controller, the abnormality detection unit may include: an upper current detection resistance arranged on a positive-side power supply line to which the at least one upper arm are connected; a lower current detection resistance arranged on a negative-side power supply line to which the at least one lower arm are connected; and a plurality of current detection units configured to individually detect a voltage between terminals of the upper current detection resistance and the lower current detection resistance.

In the above-described motor controller, the lower current detection resistance may be arranged between a connection point of connecting ground sides of the multiphase arm included in the plurality of motor drive circuits and the ground. Each of the plurality of current detection units detect the voltage between terminals of the lower current detection resistance, and may include: an operational amplifier to which the voltage between terminals of the lower current detection resistance is input; and a sample-hold circuit configured to sample-hold an output voltage from the operational amplifier, an A/D conversion unit configured to convert a sample-hold signal of the sample-hold circuit into a digital signal is provided in either one of the current detection unit or the control operation device.

In the above-described motor controller, the A/D conversion unit may set a main sampling period in which a single-phase on state or a double-phase on state of the at least one upper arm, which is needed for controlling a switching element included in the plurality of motor drive circuits in one cycle of a pulse width modulation signal is detected, and a sub sampling period in which an on state period of a switching element of one of the upper arms that is not in an on state in the main sampling period is detected.

In the above-described motor controller, the abnormality detection unit may detect a disconnection abnormality of at least one of the plurality of coil units included in the multiphase motor windings of the multiphase electric motor, and when the abnormality detection unit detects the disconnection abnormality of at least one of the plurality of coil units, the control operation device may correct and increase a current control gain for one of the multiphase motor windings at which the disconnection abnormality occurs in order to suppress a torque change.

In the above-described motor controller, the abnormality detection unit may detect a disconnection abnormality of at least one of the plurality of coil units included in the multiphase motor windings of the multiphase electric motor, and when the abnormality detection unit detects the disconnection abnormality of at least one of the plurality of coil units, the control operation device may reduce a back electromotive voltage compensation gain in order to compensate a drop of a back electromotive voltage.

In the above-described motor controller, the abnormality detection unit may detect a change amount of a motor-phase resistance value based on a motor-phase voltage detection value, a motor-phase resistance, a motor-phase current detection value, and a motor back electromotive voltage constant, and when the change amount of the motor-phase resistance value is equal to or larger than a threshold, the abnormality detection unit may determine the disconnection abnormality of at least one of the plurality of coil units included in the multiphase motor windings of the multiphase electric motor.

The above-described motor controller may further include a motor angle detection unit configured to detect a motor rotational angle of the multiphase electric motor. The control operation device may include: an instruction value operation unit configured to output an instruction value for driving the multiphase electric motor; and a multiphase current instruction value operation unit configured to calculate a multiphase current instruction value base on an instruction value output from the instruction value operation unit and the motor rotational angle detected by the motor angle detection unit.

The above-described motor controller may further include a plurality of overcurrent determination units configured to individually determine whether or not each of the current values detected by the plurality of current detection units is in an overcurrent state where the current value exceeds an overcurrent threshold. When a determination result of any one of the plurality of overcurrent determination units is the overcurrent state, the any one of the plurality of overcurrent determination units may cut off one of the plurality of motor current cutoff units connected to the motor drive circuit.

The above-described motor controller may further include: a plurality of overcurrent determination units configured to individually determine whether or not each of the current values detected by the plurality of current detection units is in an overcurrent state where the current value exceeds an overcurrent threshold; and a plurality of current bypass circuits connected between a power supply system that individually supplies power to the plurality of motor drive circuits and the ground. Each of the plurality of current bypass circuits comprises a switch unit, and when a determination result of any one of the plurality of overcurrent determination units is the overcurrent state, the switch unit may be controlled to be in the on state.

The above-described motor controller may further include an overcurrent determination unit diagnosis unit configured to supply an overcurrent diagnosis signal to the plurality of overcurrent determination units in order to diagnose whether or not the plurality of overcurrent determination units are normal.

In the above-described motor controller, each of the plurality of current detection units configured to detect the voltage between the terminals of the lower current detection resistance may include a peak-hold circuit configured to peak-hold an output voltage from the operational amplifier, and a peak-hold signal of the peak-hold circuit may be supplied to the overcurrent determination unit.

The above-described motor controller may further include a bypass diagnosis unit configured to supply an overcurrent diagnosis signal to the plurality of current bypass circuits to diagnose whether or not the plurality of current bypass circuits is normal.

In the above-described motor controller, a protection circuit configured to suppress a short-circuit current may be arranged between the plurality of motor drive circuits.

The above-described motor controller may further include: a motor current cutoff diagnosis unit configured to diagnose an operation state of any one of the plurality of motor current cutoff units; and a drive state determination unit configured to determine a high torque motor drive state where a current value of the motor current is equal to or higher than a predefined value or a low torque motor drive state where the current value of the motor current is lower than the predefined value, according to the operation state of the at least one of the plurality of motor current cutoff units. When the determination result of the drive state determination unit is the high torque motor drive state, the motor current cutoff diagnosis unit temporarily may cut off the motor current cutoff unit in the high torque drive state in order to diagnose the operation state of the motor current cutoff diagnosis unit.

In the above-described motor controller, the abnormality detection unit may include: an upper current detection resistance arranged on a positive-side power supply line to which the at least one upper arm are connected; a lower current detection resistance arranged on a negative-side power supply line to which the at least one lower arm are connected; and a plurality of current detection units configured to individually detect a voltage between terminals of the upper current detection resistance and the lower current detection resistance. The motor electric cutoff diagnosis unit may determine that the motor cutoff unit is normal, when the current detection unit detects a non-conductive state, and determines that the motor cutoff unit is has a short-circuit failure, when the current detection unit detects a conductive state.

The above-described motor controller may further include: a plurality of power supply cutoff units individually arranged between the plurality of motor drive circuits and a power supply; a current cutoff diagnosis unit configured to diagnose operation states of the motor current cutoff unit and the plurality of power supply cutoff units; and a drive state determination unit configured to determine a high torque motor drive state where a current value of the motor current is equal to or higher than a predefined value or a low torque motor drive state where the current value of the motor current is lower than the predefined value, according to the operation state of the at least one of the plurality of motor current cutoff units. The current cutoff diagnosis unit may include: a first diagnosis unit configured to temporarily cut off the motor current cutoff unit to diagnose the operation state of the motor current cutoff unit, when the determination result of the drive state determination unit is the high torque motor drive state; a second diagnosis unit configured to temporarily cut off the power supply cutoff unit to diagnose the operation state of the power supply cutoff unit, when the determination result of the drive state determination unit is the high torque motor drive state; and a third diagnosis unit configured to temporarily cut off the motor current cutoff unit and the power supply cutoff unit to diagnose the operation states of the motor current cutoff unit and the power supply cutoff unit, when the determination result of the drive state determination unit is the low torque motor drive state.

In the above-described motor controller, the abnormality detection unit may include: an upper current detection resistance arranged on a positive-side power supply line to which the at least one upper arm are connected; a lower current detection resistance arranged on a negative-side power supply line to which the at least one lower arm are connected; and a plurality of current detection units configured to individually detect a voltage between terminals of the upper current detection resistance and the lower current detection resistance. The first diagnosis unit may determine that the motor cutoff unit is normal, when the current detection unit configured to individually detect a voltage between terminals of the upper current detection resistance and the lower current detection resistance detects a non-conductive state, and the first diagnosis unit may determine that a short-circuit failure occurs at the motor cutoff unit, when the current detection unit detects a conductive state.

In the above-described motor controller, the abnormality detection unit may include: an upper current detection resistance arranged on a positive-side power supply line to which the at least one upper arm are connected; a lower current detection resistance arranged on a negative-side power supply line to which the at least one lower arm are connected; and a plurality of current detection units configured to individually detect a voltage between terminals of the upper current detection resistance and the lower current detection resistance. The second diagnosis unit may determine that the power supply cutoff unit is normal, when the current detection unit configured to individually detect a voltage between terminals of the upper current detection resistance and the lower current detection resistance detects a non-conductive state, and the second diagnosis unit may determine that a short-circuit failure occurs at the power supply cutoff unit, when the current detection unit detects a conductive state.

In the above-described motor controller, the third diagnosis unit may include an input voltage detection unit configured to detect an input voltage on the power supply cutoff unit side of the motor drive circuit, the third diagnosis unit may determine that the motor cutoff unit and the power supply cutoff unit are normal, when the input voltage detected by the input voltage detection unit drops in cutoff states of the motor cutoff unit and the power supply cutoff unit, and the third diagnosis unit may determine that a short-circuit failure occurs at either one of the motor cutoff unit or the power supply cutoff unit, when the input voltage detected by the input voltage detection unit does not drop.

According to yet another aspect of the present invention, there is provided an electric power steering device, including the above-described motor controller, the motor controller may include an electric motor that generates a steering assistance force at a steering mechanism.

The electric power steering device may further include: a steering torque detection unit configured to detect a rotational angle of an input/output side of a torsion bar arranged in a steering system in order to detect steering torque; a motor rotational angle detection unit comprising a resolver configured to detect a motor rotational angle of the multiphase electric motor; a motor angle abnormality detection unit configured to detect the abnormality of the motor rotational angle detection unit; a motor rotational angle estimation unit configured to estimate a motor rotational angle due to a back electromotive voltage based on a motor current detection value and a motor voltage detection value of the multiphase electric motor and the rotational angle of output side of the torsion bar detected by the steering torque detection unit; and a motor rotational angle selection unit configured to select an estimation value of the motor rotational angle estimated by the motor rotational angle estimation unit, instead of the motor rotational angle detected by the motor rotational angle detection unit, when the motor angle abnormality detection unit detects the abnormality of the motor rotational angle detection unit.

According to yet another aspect of the present invention, there is provided a vehicle including the above-described motor controller.

REFERENCE SIGNS LIST

1 . . . steering wheel, 2 . . . steering shaft, 3 . . . steering torque sensor, 3a . . . torsion bar, 3b . . . input side rotational angle sensor, 3c . . . output side rotational angle sensor, 8 . . . steering gear, 10 . . . steering assistance mechanism, 12 . . . three-phase electric motor, La . . . A-phase motor winding, Lb . . . B-phase motor winding, Lc . . . C-phase motor winding, L1 to L3 . . . coil unit, 20 . . . motor controller, 21 . . . vehicle speed sensor, 22 . . . battery, 31 . . . control operation device, 32A . . . first motor drive circuit, 32B . . . second motor drive circuit, 33A . . . first motor current cutoff circuit, 33B . . . second motor current cutoff circuit, 34 . . . steering assistance current instruction value operation unit, 35 . . . compensation control operation unit, 36 . . . adder, 37 . . . d-q axis current instruction value operation unit, 38 . . . voltage instruction value operation unit, 39A1, 39A2, 39B1, 39B2 . . . current detection circuit, 40A, 40B . . . voltage detection circuit, 41A, 41B . . . gate drive circuit, 42A, 42B . . . inverter circuit, 44A, 44B . . . power supply cutoff unit, 50 . . . alarm circuit, 61 . . . adder, 62 . . . current feedback controller, 63 . . . adder, 64 . . . back electromotive voltage compensator, 65 . . . subtracter, 70A, 70B . . . overcurrent-time cutoff circuit, 71 . . . AND circuit, 72 . . . maximum value selection circuit, 73 . . . amplifier, 74 . . . overcurrent determination circuit, 75 . . . instruction value correction unit, 80A, 80B . . . current bypass circuit, 81 . . . field effect transistor, 82 . . . protection resistance, 85A, 85B . . . overcurrent suppression unit, 86 . . . main motor rotational angle detection circuit, 87 . . . sub motor rotational angle detection circuit, 88 . . . angle selection unit, 91 . . . steering angle sensor, 92 . . . vernier operation unit, 93 . . . average circuit, 94 . . . integration circuit

The invention claimed is:

1. A motor controller that drives and controls a multiphase electric motor, the motor controller comprising:
a plurality of motor drive circuits configured to supply multiphase motor drive current to multiphase motor windings of the multiphase electric motor;
a control operation device configured to drive and control the plurality of motor drive circuits;
a plurality of motor current cutoff units respectively arranged between the plurality of motor drive circuits and the multiphase motor windings; and
an abnormality detection unit configured to detect an abnormality of at least one of the plurality of motor drive circuits,
wherein when the abnormality detection unit does not detect the abnormality, the control operation device controls the plurality of motor drive circuits to supply the multiphase motor drive current to the multiphase motor windings,
wherein when the abnormality detection unit detects the abnormality, the control operation device cuts off any of the plurality of motor current cutoff units connected to any of the plurality of motor drive circuits where the abnormality occurs,
wherein each of the plurality of motor drive circuits includes a multiphase inverter circuit having at least one upper arm and at least one lower arm having a number of arms corresponding to the number of phases of the multiphase electric motor, and configured to supply the multiphase motor drive current to the multiphase electric motor,
wherein the abnormality detection unit detects at least one of an open failure or a short-circuit failure of the at least one upper arm and the at least one lower arm included in the plurality of motor drive circuits,
wherein the abnormality detection unit comprises:
an upper current detection resistance arranged on a positive-side power supply line to which the at least one upper arm are connected;
a lower current detection resistance arranged on a negative-side power supply line to which the at least one lower arm are connected; and
a plurality of current detection units configured to individually detect a voltage between terminals of the upper current detection resistance and the lower current detection resistance, and
wherein the motor controller further comprises:
a plurality of overcurrent determination units configured to individually determine whether or not each of the current values detected by the plurality of current detection units is in an overcurrent state where the current value exceeds an overcurrent threshold; and
a plurality of current bypass circuits connected between a power supply system that individually supplies power to the plurality of motor drive circuits and the ground,
wherein each of the plurality of current bypass circuits comprises a switch unit, and
wherein when a determination result of any one of the plurality of overcurrent determination units is the overcurrent state, the switch unit is controlled to be in the on state.

2. The motor controller according to claim 1,
wherein the abnormality detection unit detects the abnormality of at least one of the plurality of motor drive circuits and the plurality of multiphase electric motor,
wherein in the multiphase electric motor, the multiphase motor windings that are wound around a stator are respectively connected in parallel with a plurality of coil units, and
wherein when the abnormality detection unit detects the abnormality, the control operation device changes a drive mode of driving the plurality of motor drive circuits depending on an abnormality mode.

3. The motor controller according to claim 2,
wherein the abnormality detection unit detects a disconnection abnormality of at least one of the plurality of coil units included in the multiphase motor windings of the multiphase electric motor, and
wherein when the abnormality detection unit detects the disconnection abnormality of at least one of the plurality of coil units, the control operation device corrects and increases a current control gain for one of the multiphase motor windings at which the disconnection abnormality occurs in order to suppress a torque change.

4. The motor controller according to claim 2,
wherein the abnormality detection unit detects a disconnection abnormality of at least one of the plurality of coil units included in the multiphase motor windings of the multiphase electric motor, and
wherein when the abnormality detection unit detects the disconnection abnormality of at least one of the plurality of coil units, the control operation device reduces a back electromotive voltage compensation gain in order to compensate a drop of a back electromotive voltage.

5. The motor controller according to claim 1,
further comprising a motor angle detection unit configured to detect a motor rotational angle of the multiphase electric motor,
wherein the control operation device comprises:
an instruction value operation unit configured to output an instruction value for driving the multiphase electric motor; and a multiphase current instruction value operation unit configured to calculate a multiphase current instruction value base on an instruction value output from the instruction value operation unit and the motor rotational angle detected by the motor angle detection unit.

6. The motor controller according to claim 1, wherein a protection circuit configured to suppress a short-circuit current is arranged between the plurality of motor drive circuits.

7. The motor controller according to claim 1 further comprising:
a motor current cutoff diagnosis unit configured to diagnose an operation state of any one of the plurality of motor current cutoff units; and
a drive state determination unit configured to determine a high torque motor drive state where a current value of the motor current is equal to or higher than a predefined value or a low torque motor drive state where the current value of the motor current is lower than the predefined value, according to the operation state of the at least one of the plurality of motor current cutoff units,
wherein when the determination result of the drive state determination unit is the high torque motor drive state, the motor current cutoff diagnosis unit temporarily cuts off the motor current cutoff unit in the high torque drive state in order to diagnose the operation state of the motor current cutoff diagnosis unit.

8. The motor controller according to claim 1, further comprising:
    a plurality of power supply cutoff units individually arranged between the plurality of motor drive circuits and a power supply;
    a current cutoff diagnosis unit configured to diagnose operation states of the motor current cutoff unit and the plurality of power supply cutoff units; and
    a drive state determination unit configured to determine a high torque motor drive state where a current value of the motor current is equal to or higher than a predefined value or a low torque motor drive state where the current value of the motor current is lower than the predefined value, according to the operation state of the at least one of the plurality of motor current cutoff units,
    wherein the current cutoff diagnosis unit comprises:
        a first diagnosis unit configured to temporarily cut off the motor current cutoff unit to diagnose the operation state of the motor current cutoff unit, when the determination result of the drive state determination unit is the high torque motor drive state;
        a second diagnosis unit configured to temporarily cut off the power supply cutoff unit to diagnose the operation state of the power supply cutoff unit, when the determination result of the drive state determination unit is the high torque motor drive state; and
        a third diagnosis unit configured to temporarily cut off the motor current cutoff unit and the power supply cutoff unit to diagnose the operation states of the motor current cutoff unit and the power supply cutoff unit, when the determination result of the drive state determination unit is the low torque motor drive state.

9. An electric power steering device, comprising the motor controller according to claim 1,
    wherein the motor controller comprises an electric motor that generates a steering assistance force at a steering mechanism.

10. The electric power steering device according to claim 9, further comprising:
    a steering torque detection unit configured to detect a rotational angle of an input/output side of a torsion bar arranged in a steering system in order to detect steering torque;
    a motor rotational angle detection unit comprising a resolver configured to detect a motor rotational angle of the multiphase electric motor;
    a motor angle abnormality detection unit configured to detect the abnormality of the motor rotational angle detection unit;
    a motor rotational angle estimation unit configured to estimate a motor rotational angle due to a back electromotive voltage based on a motor current detection value and a motor voltage detection value of the multiphase electric motor and the rotational angle of output side of the torsion bar detected by the steering torque detection unit; and
    a motor rotational angle selection unit configured to select an estimation value of the motor rotational angle estimated by the motor rotational angle estimation unit, instead of the motor rotational angle detected by the motor rotational angle detection unit, when the motor angle abnormality detection unit detects the abnormality of the motor rotational angle detection unit.

* * * * *